United States Patent
Masuoka et al.

(10) Patent No.: US 9,627,494 B2
(45) Date of Patent: Apr. 18, 2017

(54) PILLAR-SHAPED SEMICONDUCTOR DEVICE AND PRODUCTION METHOD THEREFOR

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/976,691

(22) Filed: Dec. 21, 2015

(65) Prior Publication Data
US 2016/0204251 A1    Jul. 14, 2016

(30) Foreign Application Priority Data
Jan. 8, 2015    (WO) .................. PCT/JP2015/050391

(51) Int. Cl.
    *H01L 29/66*      (2006.01)
    *H01L 29/417*      (2006.01)
    (Continued)

(52) U.S. Cl.
    CPC .... *H01L 29/41741* (2013.01); *H01L 21/2855* (2013.01); *H01L 21/28518* (2013.01);
    (Continued)

(58) Field of Classification Search
    CPC ........... H01L 29/66666; H01L 29/7827; H01L 29/78642
    See application file for complete search history.

(56) References Cited

U.S. PATENT DOCUMENTS

| 5,010,386 A | 4/1991 | Groover, III |
| 5,308,778 A | 5/1994 | Fitch et al. |

(Continued)

FOREIGN PATENT DOCUMENTS

| JP | H02-188966 A | 7/1990 |
| JP | 03-291963 A | 12/1991 |

(Continued)

OTHER PUBLICATIONS

Lam, H., "SIMOX SOI for Integrated Circuit Fabrication", *IEEE Circuit and Devices Magazine*, Jul. 1987, pp. 6-11.

(Continued)

*Primary Examiner* — Victor A Mandala
*Assistant Examiner* — Regan J Rundio
(74) *Attorney, Agent, or Firm* — Brinks Gilson & Lione

(57) ABSTRACT

A $SiO_2$ layer is formed at a middle of a Si pillar. An opening is formed in a gate insulating layer and a gate conductor layer in a peripheral portion that includes a side surface of the $SiO_2$ layer. Two stacks of layers, each stack being constituted by a Ni layer, a poly-Si layer containing a donor or acceptor impurity atom, and a $SiO_2$ layer, are formed in a peripheral portion of the opening, and heat treatment is performed to silicidate the poly-Si layers into NiSi layers. The NiSi layers protrude and come into contact with the side surface of the Si pillar by silicidation, and a donor or acceptor impurity atom diffuses from the NiSi layers into the Si pillar. Thus an $N^+$ region and a $P^+$ region serving as a source and a drain of surrounding gate MOS transistors are respectively formed above and under the $SiO_2$ layer.

18 Claims, 13 Drawing Sheets

(51) Int. Cl.
- *H01L 21/28* (2006.01)
- *H01L 29/78* (2006.01)
- *H01L 27/092* (2006.01)
- *H01L 29/06* (2006.01)
- *H01L 21/70* (2006.01)
- *H01L 29/45* (2006.01)
- *H01L 21/285* (2006.01)
- *H01L 21/8238* (2006.01)
- *H01L 29/08* (2006.01)
- *H01L 29/10* (2006.01)
- *H01L 29/423* (2006.01)
- *H01L 21/822* (2006.01)
- *H01L 27/06* (2006.01)

(52) U.S. Cl.
CPC .. *H01L 21/8221* (2013.01); *H01L 21/823814* (2013.01); *H01L 21/823842* (2013.01); *H01L 21/823885* (2013.01); *H01L 27/0688* (2013.01); *H01L 27/092* (2013.01); *H01L 29/0847* (2013.01); *H01L 29/1037* (2013.01); *H01L 29/42356* (2013.01); *H01L 29/456* (2013.01); *H01L 29/66666* (2013.01); *H01L 29/7827* (2013.01); *H01L 29/7848* (2013.01); *H01L 21/823828* (2013.01); *H01L 29/665* (2013.01)

(56) References Cited

U.S. PATENT DOCUMENTS

| | | |
|---|---|---|
| 5,308,782 A | 5/1994 | Mazure et al. |
| 5,398,200 A | 3/1995 | Mazure et al. |
| 5,612,563 A | 3/1997 | Fitch et al. |
| 2008/0173933 A1 | 7/2008 | Fukuzumi et al. |
| 2013/0037823 A1 | 2/2013 | Kanemura et al. |

FOREIGN PATENT DOCUMENTS

| | | | |
|---|---|---|---|
| JP | 06-13623 A | 1/1994 | |
| JP | 2007-250652 A | 9/2007 | |
| JP | 2008-172164 A | 7/2008 | |
| JP | 2013-38336 A | 2/2013 | |
| JP | WO 2014141485 A1 * | 9/2014 | ........... H01L 27/092 |
| JP | 5612237 B1 | 10/2014 | |
| JP | 5639317 B1 | 12/2014 | |

OTHER PUBLICATIONS

Morimoto, T. et al., "Self-Aligned Nickel-Mono-Silicide Technology for High-Speed Deep Submicrometer Logic CMOS ULSI", *IEEE Transactions on Electron Devices*, vol. 42, No. 5, May 1995, pp. 915-922.

Shibata et al., "A New Field Isolation Technology for High Density MOS LSI", *Japanese Journal of Applied Physics*, vol. 18, Supplement 18-1, 1979, pp. 263-267.

Takato, H. et al., "Impact of Surrounding Gate Transistor (SGT) for Ultra-High-Density LSI's", *IEE Transactions on Electron Devices*, vol. 38, No. 3, Mar. 1991, pp. 573-578.

Thompson, S. et al., "Uniaxial-Process-Induced Strained-Si: Extending the CMOS Roadmap", *IEEE Transactions on Electron Devices*, vol. 53, No. 5, May 2006, pp. 1010-1020.

Ting, C.Y. et al., "Study of Planarized Sputter-Deposited $SiO_2$", *J. Vac. Sci. Technol.*, vol. 15, No. 3, May/Jun. 1978, pp. 1105-1112.

* cited by examiner

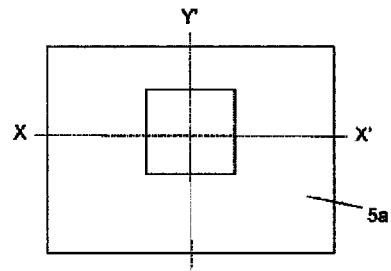
FIG. 1AA
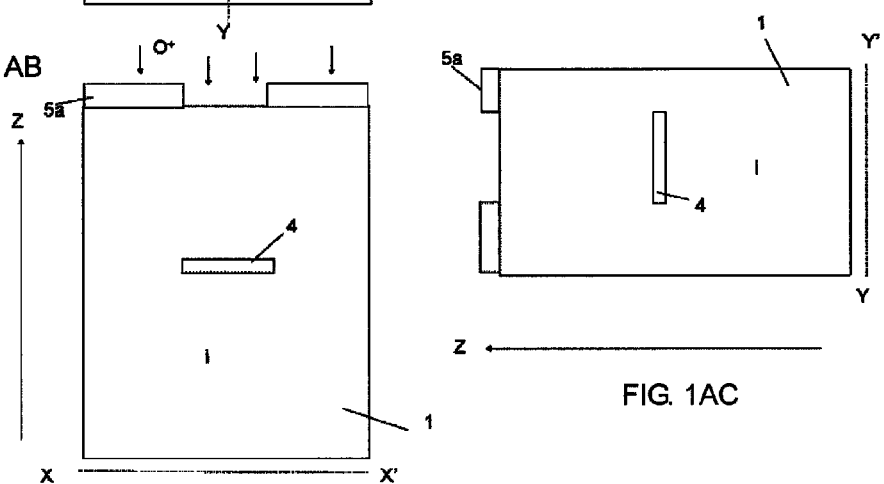
FIG. 1AB
FIG. 1AC
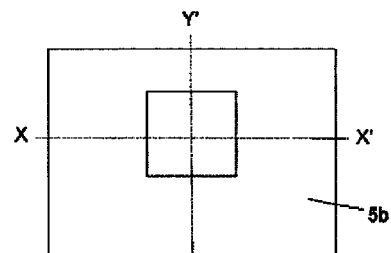
FIG. 1BA
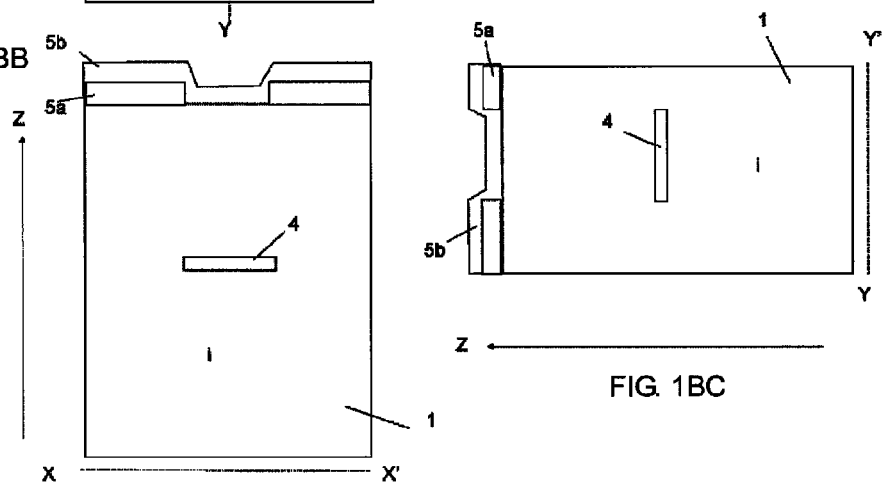
FIG. 1BB
FIG. 1BC

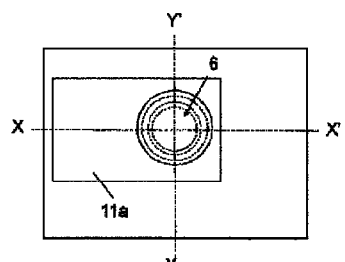
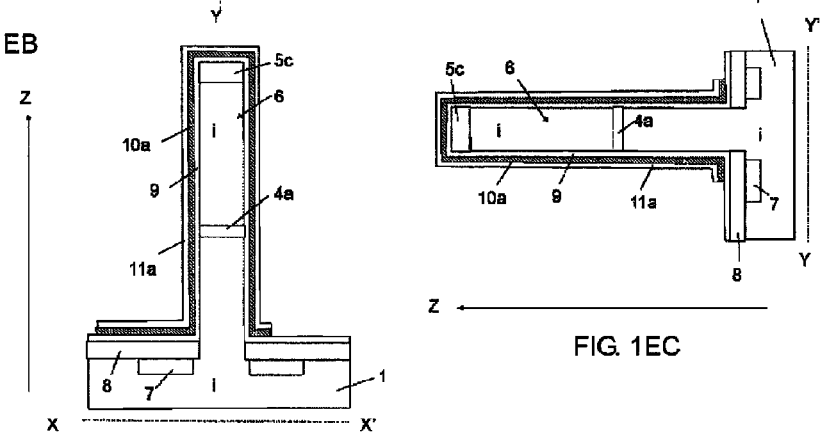
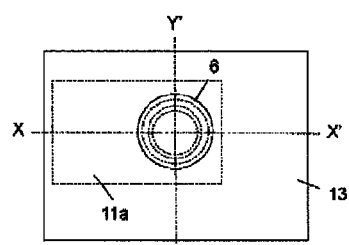
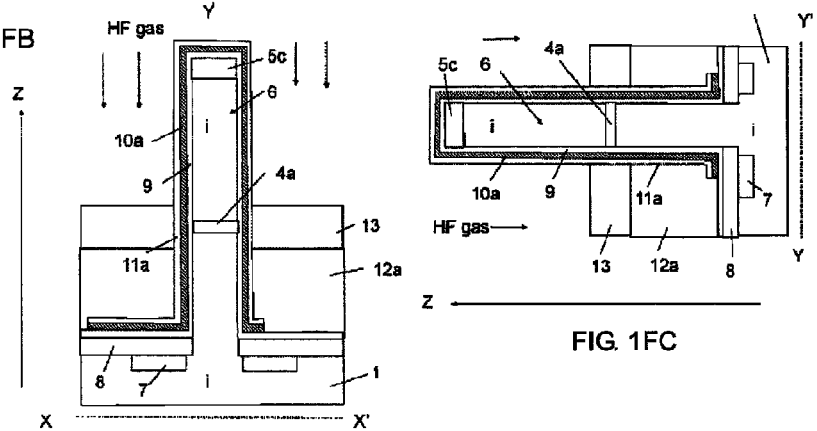
FIG. 1EA
FIG. 1EB
FIG. 1EC
FIG. 1FA
FIG. 1FB
FIG. 1FC FIG. 1GA
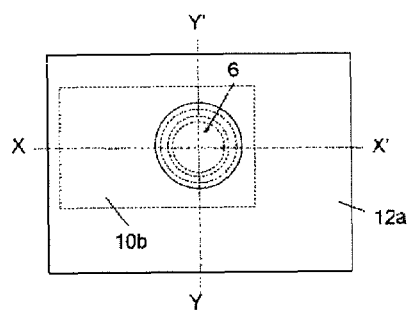
FIG. 1GB
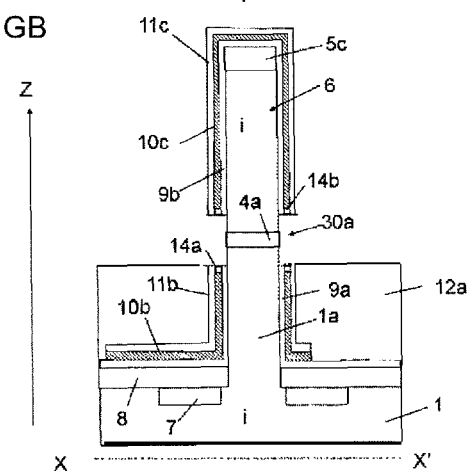
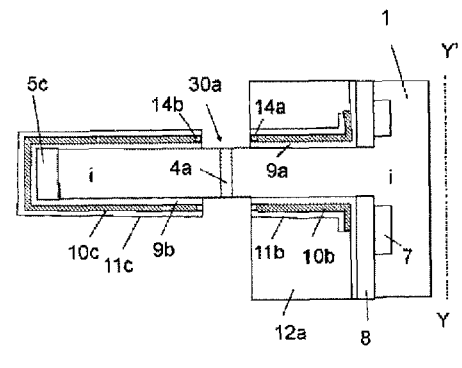
FIG. 1GC

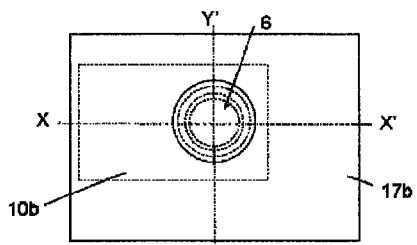
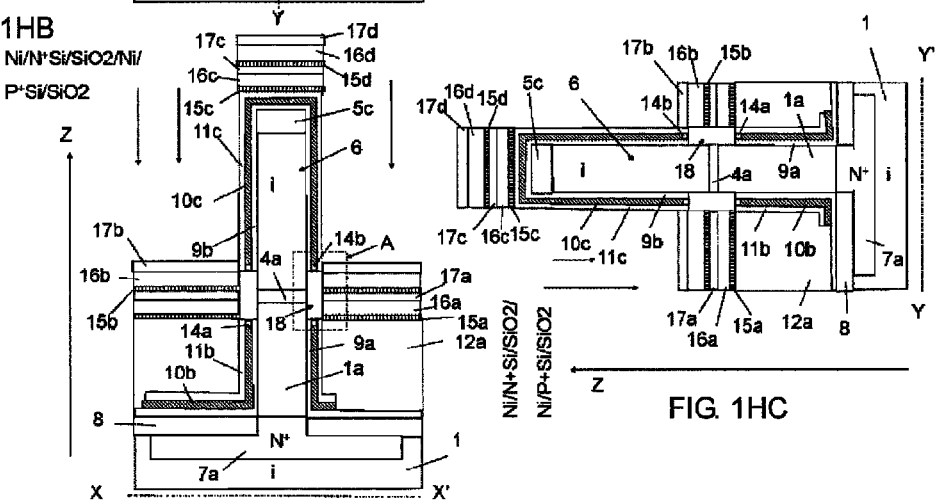
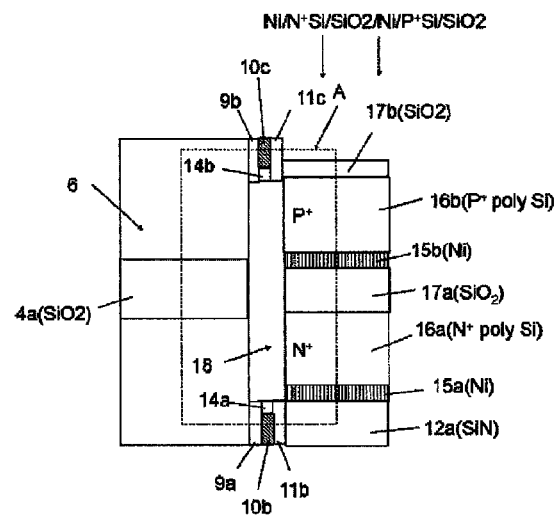
FIG. 1HA
FIG. 1HB
FIG. 1HC
FIG. 1HD

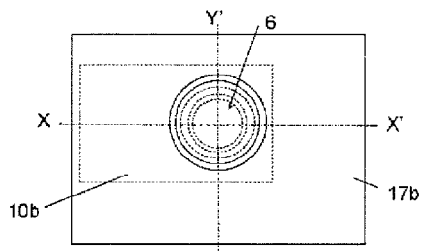
FIG. 1IA
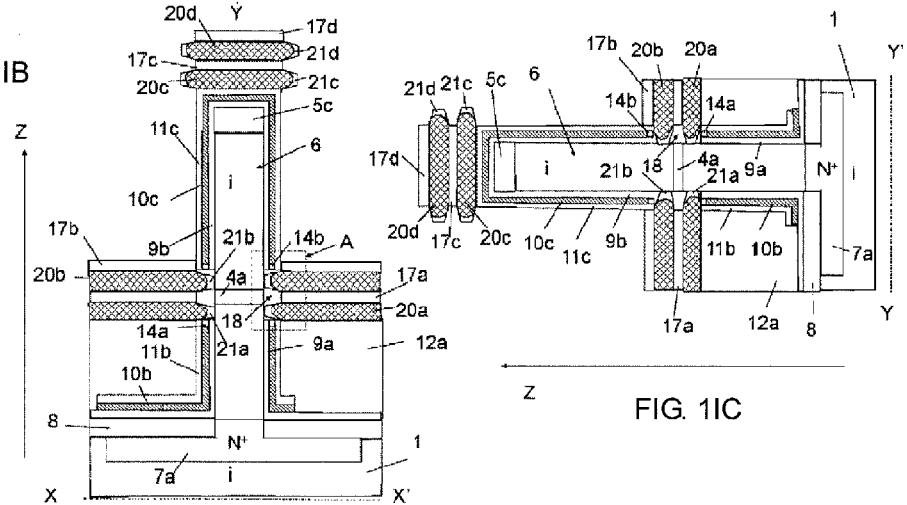
FIG. 1IB
FIG. 1IC
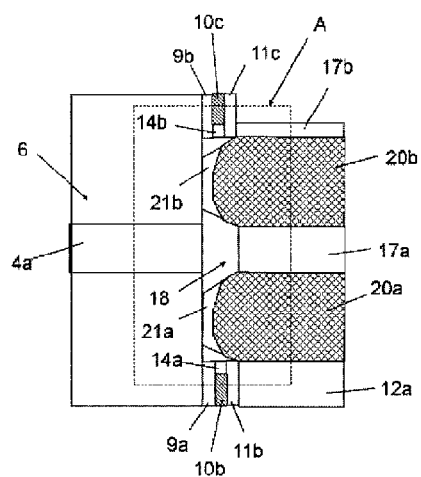
FIG. 1ID

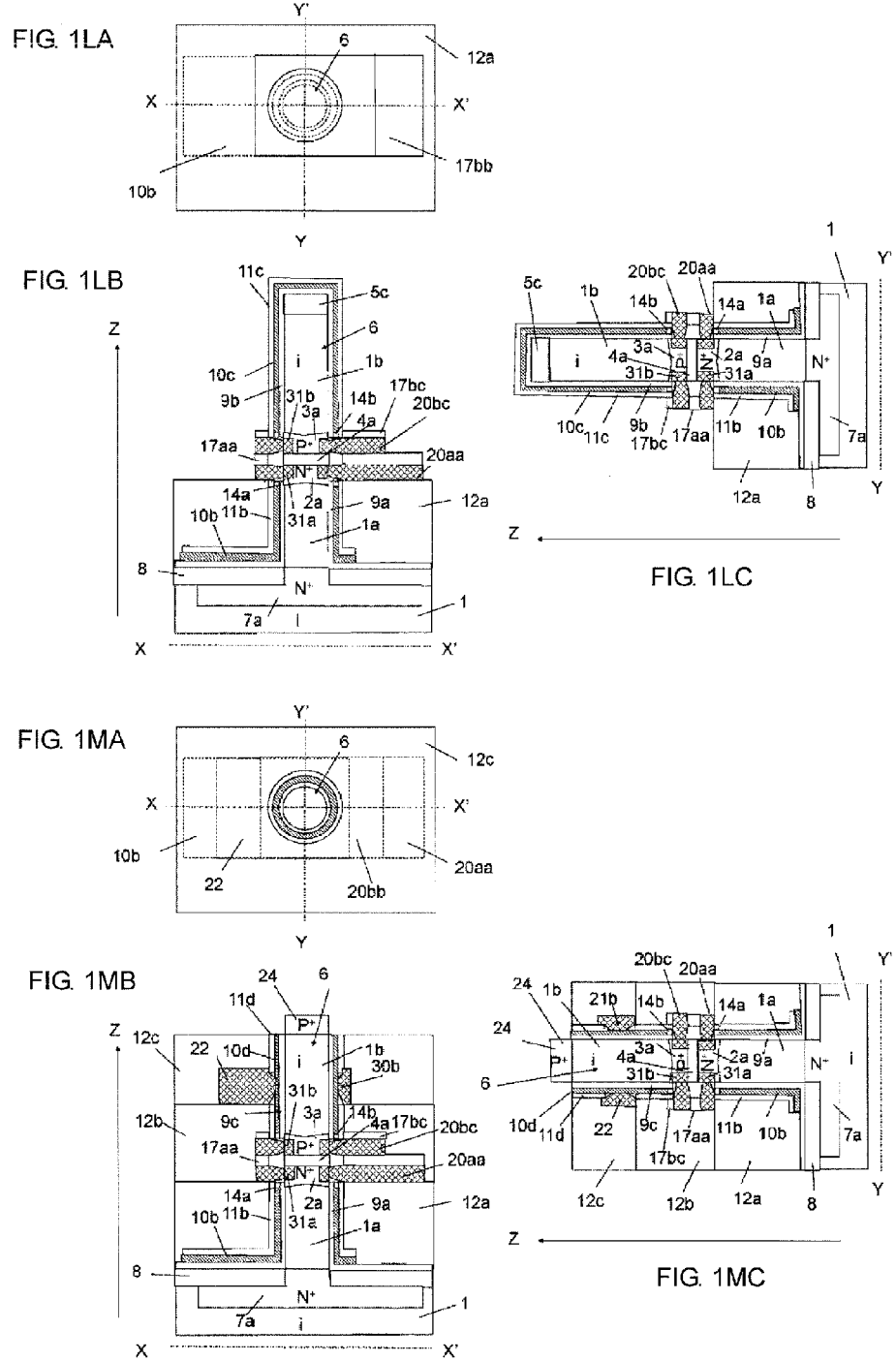

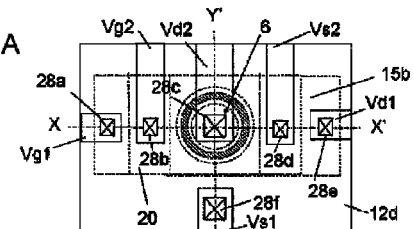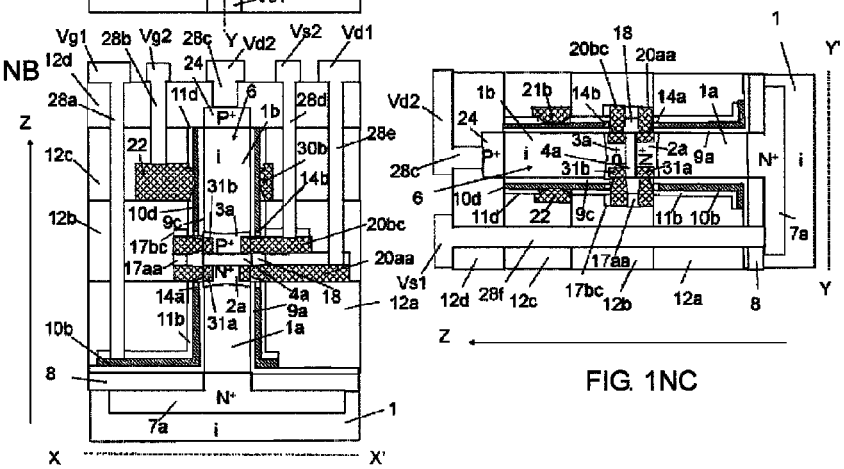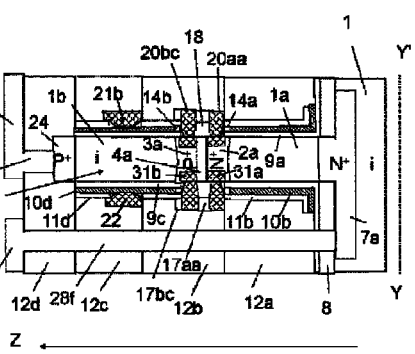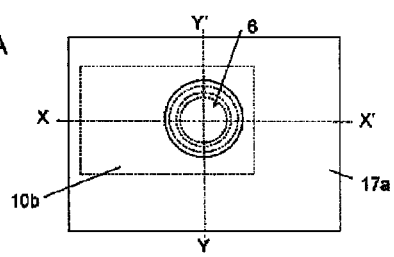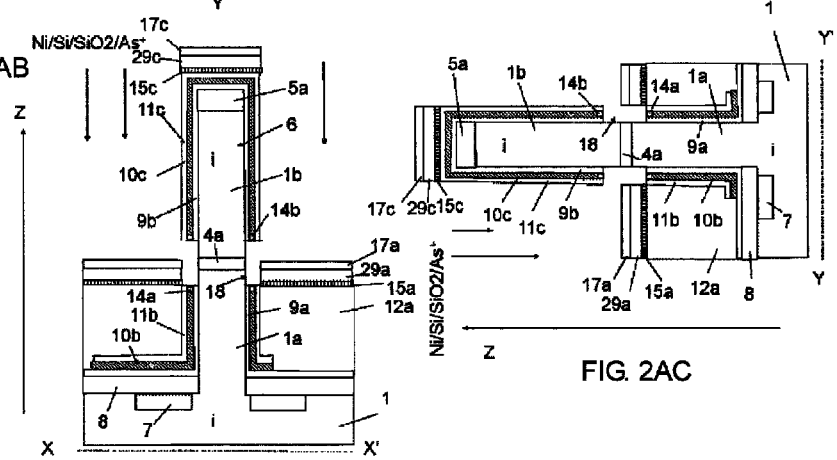

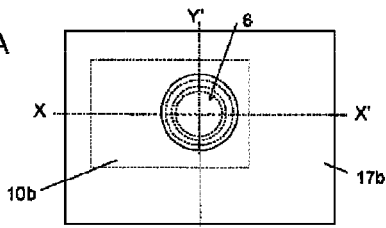
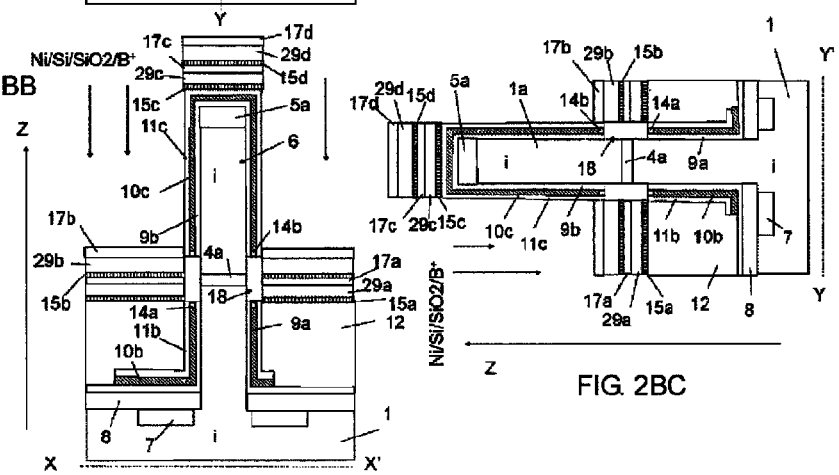
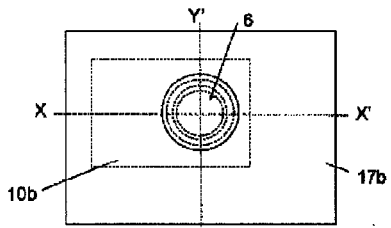
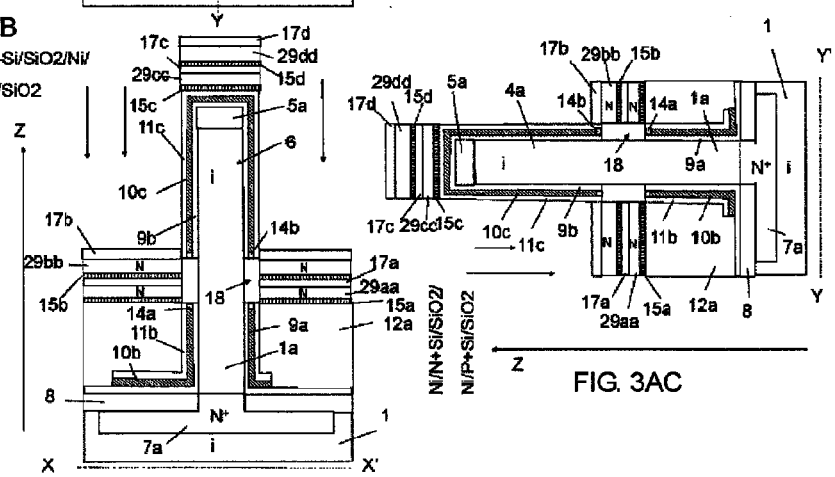

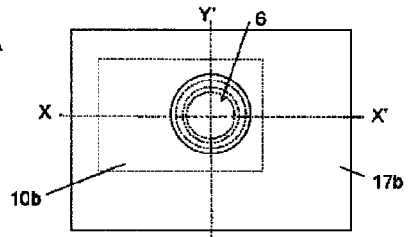
FIG. 3BA
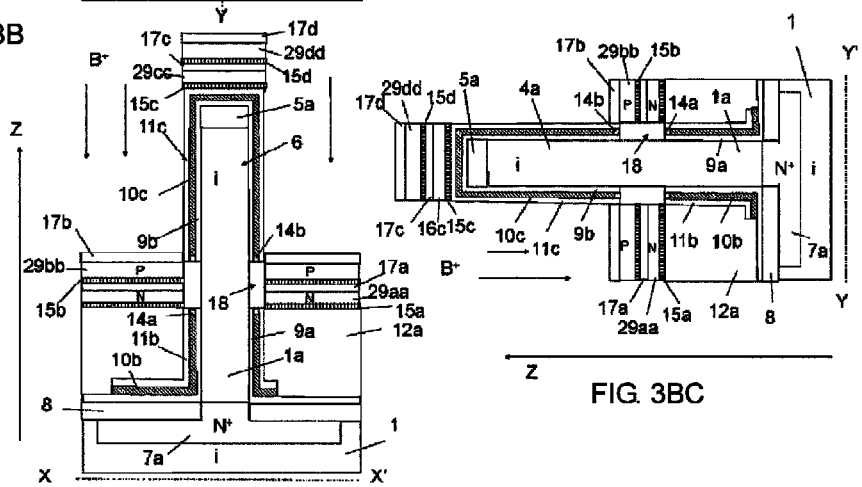
FIG. 3BB
FIG. 3BC
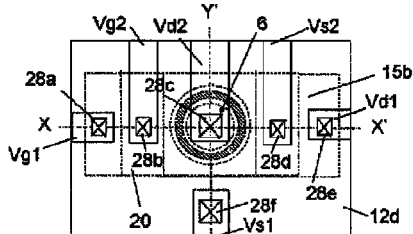
FIG. 4A
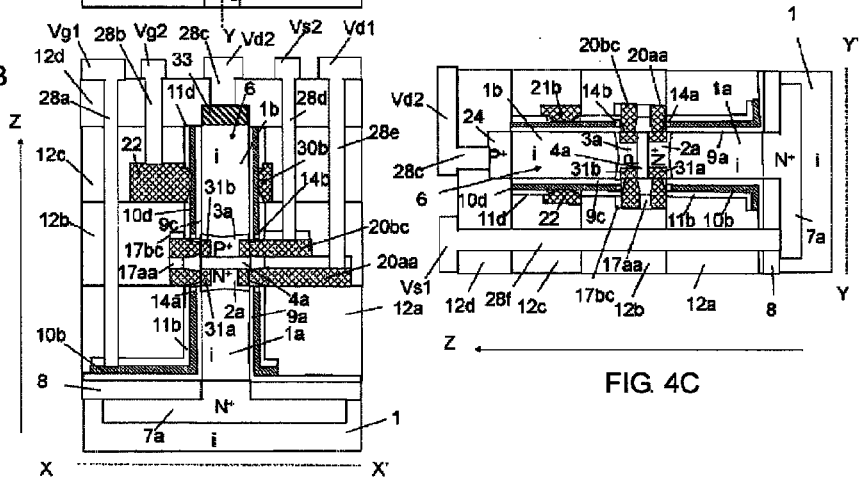
FIG. 4B
FIG. 4C

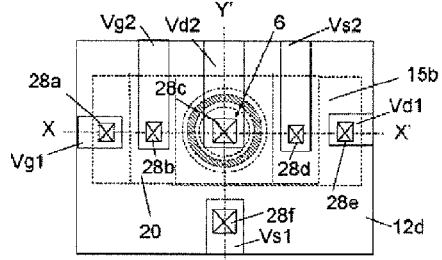
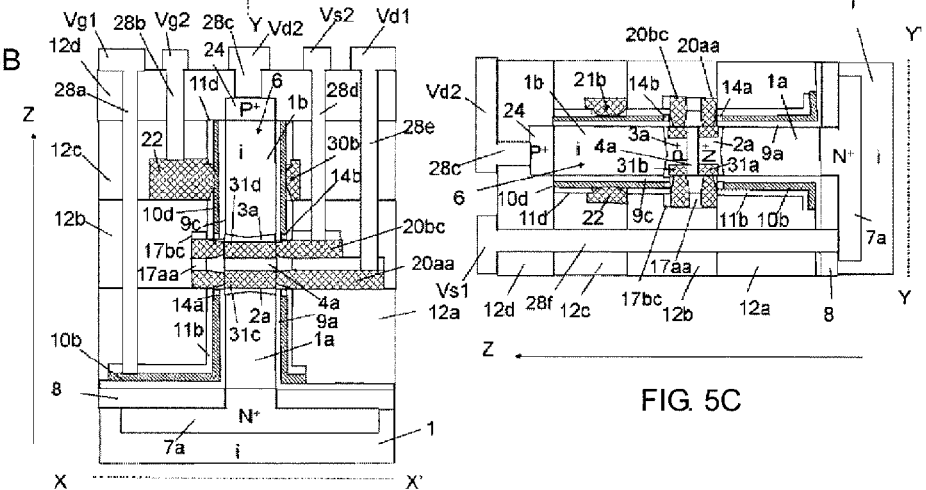
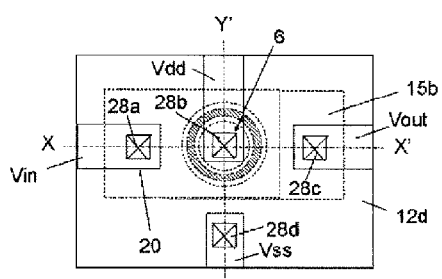
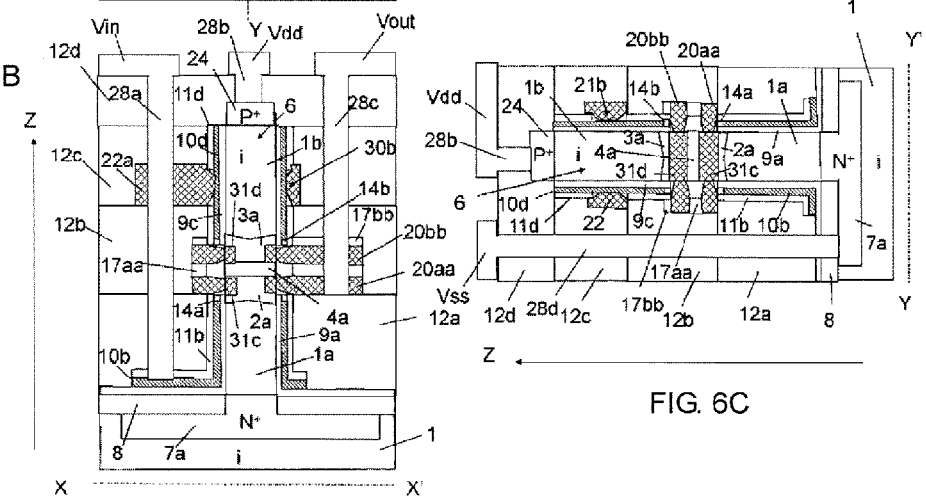

US 9,627,494 B2

PILLAR-SHAPED SEMICONDUCTOR DEVICE AND PRODUCTION METHOD THEREFOR

RELATED APPLICATIONS

This application claims priority under 35 U.S.C. §119 to International Patent Application No. PCT/JP2015/050391 filed on Jan. 8, 2015, the entire content of which is hereby incorporated by reference.

BACKGROUND OF THE INVENTION

1. Field of the Invention

The present invention relates to a pillar-shaped semiconductor device and a production method therefor.

2. Description of the Related Art

Surrounding gate MOS transistors (SGTs), which are representative examples of pillar-shaped semiconductor devices, have drawn much attention in recent years as semiconductor elements that offer highly integrated semiconductor devices. However, SGT-including semiconductor devices that achieve higher degrees of integration are in demand.

In a typical planar-type MOS transistor, a channel lies in a horizontal direction along the upper surface of a semiconductor substrate. In contrast, a channel of an SGT lies in a direction perpendicular to the upper surface of a semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be increased by using SGTs instead of planar-type MOS transistors.

FIG. 7 is a schematic diagram of an N-channel SGT. $N^+$ regions 101a and 101b (a semiconductor region having a high donor impurity concentration is referred to as an "$N^+$ region" hereinafter), which respectively serve as a source and a drain or vice versa, are respectively formed in a lower portion and an upper portion of a Si pillar 100 (a silicon semiconductor pillar is referred to as a "Si pillar" hereinafter) whose conductivity type is P-type or i-type (intrinsic). The portion of the Si pillar 100 sandwiched by the $N^+$ regions 101a and 101b serving as a source and a drain serves as a channel region 102. A gate insulating layer 103 surrounds the channel region 102, and a gate conductor layer 104 surrounds the gate insulating layer 103. In an SGT, the $N^+$ regions 101a and 101b serving as a source and a drain, the channel region 102, the gate insulating layer 103, and the gate conductor layer 104 are formed within a single Si pillar 100. Accordingly, the area of the SGT in a plan view is equal to the area of one source or drain $N^+$ region of a planar-type MOS transistor. Thus, circuit chips having SGTs achieve further size reduction compared to circuit chips having planar-type MOS transistors.

For example, as illustrated in the schematic diagram of FIG. 8, it is anticipated that the circuit area can be decreased by forming two SGTs 116a and 116b in lower and upper portions of one Si pillar 115.

FIG. 8 is a schematic diagram of a circuit in which an N-channel SGT 116a is formed in a lower portion of the Si pillar 115, and a P-channel SGT 116b is formed above the N-channel SGT 116a. The Si pillar 115 is formed on a P-layer substrate 117 (a semiconductor layer containing an acceptor impurity is referred to as a "P-layer" hereinafter). A $SiO_2$ layer 118 is formed on the P-layer substrate 117 in a peripheral region surrounding the Si pillar 115. A gate insulating layer 119a of the N-channel SGT 116a and a gate insulating layer 119b of the P-channel SGT 116b surround the Si pillar 115. A gate conductor layer 120a of the N-channel SGT 116a and a gate conductor layer 120b of the P-channel SGT 116b are formed along the outer periphery of the Si pillar 115 so as to surround the gate insulating layers 119a and 119b. An $N^+$ region 121a is formed in a surface layer portion of the P-layer substrate 117 connected to the bottom of the Si pillar 115. An $N^+$ region 121b, a $SiO_2$ layer 130 that lies on and is connected to the $N^+$ region 121b, and a $P^+$ region 122a (a semiconductor region having a high acceptor impurity concentration is referred to as a "$P^+$ region" hereinafter) that lies on and is connected to the $SiO_2$ layer 130 are formed in a middle portion of the Si pillar 115. A $P^+$ region 122b is formed in a top portion of the Si pillar 115. The $N^+$ region 121a serves as a source of the N-channel SGT 116a, and the $N^+$ region 121b serves as a drain of the N-channel SGT 116a. The part of the Si pillar 115 sandwiched by the $N^+$ region 121a and $N^+$ region 121b is a channel region 123a of the N-channel SGT 116a. The $P^+$ region 122b serves as a drain of the P-channel SGT 116b, and the $P^+$ region 122a serves as a source of the P-channel SGT 116b. The part of the Si pillar 115 sandwiched between the $P^+$ region 122a and the $P^+$ region 122b is a channel region 123b of the P-channel SGT 116b. A nickel silicide layer (NiSi layer) 125a is formed in a surface layer portion of the $N^+$ region 121a connected to the bottom of the Si pillar 115. In a central portion of the Si pillar 115, a NiSi layer 125b is formed along the outer periphery of the $N^+$ region 121b and a NiSi layer 125c is formed along the outer periphery of the $P^+$ region 122a. A NiSi layer 125d is formed in an upper surface layer of the $P^+$ region 122b in the top portion of the Si pillar 115. A source wiring metal layer 126a is connected to the NiSi layer 125a in the $N^+$ region 121a, and also to a VS1 terminal. A drain wiring metal layer 126b is connected to the NiSi layer 125b and also to a drain terminal VD1. A source wiring metal layer 126c is connected to the NiSi layer 125c in the $P^+$ region 122a and also to a VS2 terminal. A drain wiring metal layer 126d is connected to the NiSi layer 125d and also to a VD2 terminal. Gate wiring metal layers 127a and 127b are connected to the gate conductor layer 120a and the gate conductor layer 120b, and also to gate terminals VG1 and VG2, respectively. According to this configuration, two SGTs 116a and 116b isolated by the $SiO_2$ layer 130 are formed in the Si pillar 115.

As illustrated in FIG. 8, when two SGTs 116a and 116b isolated by the $SiO_2$ layer 130 are formed in the Si pillar 115, the following issues arise.

1. It is difficult to accurately and easily form, in a middle portion of the Si pillar 115, an $N^+$ region 121b and a $P^+$ region 122a isolated by a $SiO_2$ layer 130.

2. It is difficult to accurately and easily form a NiSi layer 125b and a NiSi layer 125c along the outer peripheries of the $N^+$ region 121b and the $P^+$ region 122a.

3. It is difficult to accurately and easily establish connection between the NiSi layer 125b and the drain wiring metal layer 126b and between the NiSi layer 125c and the source wiring metal layer 126c.

4. It is difficult to prevent bending or collapsing of the Si pillar 115 caused by the difference in linear thermal expansion coefficient between NiSi ($12\times10^{-6}$/K) and Si ($2.4\times10^{-6}$/K) in forming the NiSi layer 125b and the NiSi layer 125c in the Si pillar 115.

SUMMARY OF THE INVENTION

As discussed above, the followings are desirable in the SGT-including pillar-shaped semiconductor device shown in FIG. 8:

1. It is desirable to easily and accurately form, in the middle portion of the Si pillar 115, the N$^+$ region 121*b* and the P$^+$ region 122*a* isolated by the SiO$_2$ layer 130.

2. It is desirable to easily and accurately form the NiSi layer 125*b* and the NiSi layer 125*c* along the outer peripheries of the N$^+$ region 121*b* and the P$^+$ region 122*a*.

3. It is desirable to easily and accurately form a connection between the NiSi layer 125*b* and the drain wiring metal layer 126*b* and the connection between the NiSi layer 125*c* and the source wiring metal layer 126*c*.

4. It is desirable to prevent bending or collapsing of the Si pillar 115 caused by the difference in linear thermal expansion coefficient between NiSi ($12 \times 10^{-6}$/K) and Si ($2.4 \times 10^{-6}$/K) in forming the NiSi layer 125*b* and the NiSi layer 125*c* in the Si pillar 115.

A first aspect of the present invention provides a pillar-shaped semiconductor device that includes a semiconductor pillar standing on a substrate in a direction perpendicular to a flat surface of the substrate; a first interlayer insulating layer formed in the semiconductor pillar; a first impurity region containing donor or acceptor atoms, the first impurity region being formed in the semiconductor pillar so as to be in contact with the first interlayer insulating layer and under the first interlayer insulating layer; a second impurity region containing donor or acceptor atoms, the second impurity region being formed in the semiconductor pillar so as to be in contact with the first interlayer insulating layer and above the first interlayer insulating layer; a first alloy layer formed in the semiconductor pillar and around an outer periphery of the semiconductor pillar, the first alloy layer making contact with a side surface of the first impurity region; a second alloy layer formed in the semiconductor pillar and around the outer periphery of the semiconductor pillar, the second alloy layer making contact with a side surface of the second impurity region; and a second interlayer insulating layer disposed between the first alloy layer and the second alloy layer and having a side surface at a distance from a side surface of the semiconductor pillar.

Preferably, the pillar-shaped semiconductor device further includes a gate insulating layer surrounding the semiconductor pillar; a gate conductor layer surrounding the gate insulating layer; a third impurity region formed at a bottom of the semiconductor pillar, the third impurity region having the same conductivity type as the first impurity region; a fourth impurity region formed in the semiconductor pillar so as to be above the second impurity region, the fourth impurity region having the same conductivity type as the second impurity region; a third interlayer insulating layer in contact with a lower surface of the first alloy layer; and a fourth interlayer insulating layer in contact with an upper surface of the second alloy layer. The first impurity region, the third impurity region, a portion of the semiconductor pillar that lies between the first impurity region and the third impurity region, and the gate conductor layer may form a first surrounding gate MOS transistor in which the first impurity region and the third impurity region respectively function as a source and a drain or vice versa, the portion of the semiconductor pillar functions as a channel, and the gate conductor layer functions as a gate. The second impurity region, the fourth impurity region, a portion of the semiconductor pillar that lies between the second impurity region and the fourth impurity region, and the gate conductor layer may form a second surrounding gate MOS transistor in which the second impurity region and the fourth impurity region respectively function as a source and a drain or vice versa, the portion of the semiconductor pillar functions as a channel, and the gate conductor layer functions as a gate.

Each of the first alloy layer and the second alloy layer preferably extends to a center of the semiconductor pillar in a plan view.

The first alloy layer and the second alloy layer preferably function as wiring conductor material layers.

The first alloy layer and the second alloy layer are preferably connected to a wiring metal layer through a contact hole that penetrates the second alloy layer and the second interlayer insulating layer and has a bottom that reaches an upper surface, inside, or a lower surface of the first alloy layer, the wiring metal layer being disposed above the contact hole.

Stress preferably acts in the semiconductor pillar downward from the fourth impurity region.

A space is preferably formed between the first alloy layer and the gate conductor layer and a space is preferably formed between the second alloy layer and the gate conductor layer.

The first alloy layer preferably mainly contains the same donor or acceptor atom as one mainly contained in the first impurity region, and the second alloy layer preferably mainly contains the same donor or acceptor atom as one mainly contained in the second impurity region.

The first alloy layer and the second alloy layer are preferably separated from each other between the side surface of the semiconductor pillar and the side surface of the second interlayer insulating layer.

One of the first SGT and the second SGT is preferably an N-channel SGT while the other is preferably a P-channel SGT, and the gate conductor layer of the first SGT is preferably formed of a different material from the gate conductor layer of the second SGT.

A second aspect of the present invention provides a method for producing a pillar-shaped semiconductor device. The method includes a semiconductor pillar forming step of forming a semiconductor pillar that stands on a substrate in a direction perpendicular to a flat surface of the substrate, the semiconductor pillar having a first interlayer insulating layer inside; a stacked material layers forming step of stacking material layers in a direction perpendicular to the flat surface of the substrate so as to form, in a peripheral region surrounding the semiconductor pillar and at a distance from a side surface of the semiconductor pillar, a first metal layer, a first semiconductor layer containing donor or acceptor atoms, a second interlayer insulating layer at the same height as the first interlayer insulating layer in a perpendicular direction, a second metal layer, a second semiconductor layer containing donor or acceptor atoms, and a third interlayer insulating layer; a first and second alloy layers forming step of performing a heat treatment to form a first alloy layer by a reaction between the first metal layer and the first semiconductor layer and form a second alloy layer by a reaction between the second metal layer and the second semiconductor layer; an alloy layer/semiconductor pillar side surface contact step of performing a heat treatment to cause the first alloy layer and the second alloy layer to protrude toward the side surface of the semiconductor pillar and bring the first alloy layer and the second alloy layer into contact with the side surface of the semiconductor pillar; and after the alloy layer/semiconductor pillar side surface contact step, an inside-semiconductor-pillar alloy layer and impurity region forming step of performing a heat treatment to cause a reaction between a metal atom in the first alloy layer and the second alloy layer and a semiconductor atom in the semiconductor pillar so as to expand the first alloy layer and the second alloy layer to reach inside the semiconductor pillar, and to diffuse the donor or acceptor atoms swept out from the first alloy layer and the second alloy layer into the semiconductor pillar so as to form, inside the semiconductor pillar, a first impurity region containing the donor or acceptor atoms and contacting the first alloy layer and a second impurity region containing the donor or acceptor atoms and contacting the second alloy layer.

The method preferably further includes performing, after the semiconductor pillar forming step, a gate insulating layer forming step of forming a gate insulating layer surrounding the semiconductor pillar, a gate conductor layer forming step of forming a gate conductor layer surrounding the gate insulating layer, a fourth interlayer insulating layer forming step of forming a fourth interlayer insulating layer surrounding the gate conductor layer, a third impurity region forming step of forming a third impurity region at a bottom of the semiconductor pillar, the third impurity region containing donor or acceptor atoms, a fifth interlayer insulating layer forming step of forming a fifth interlayer insulating layer in the peripheral region surrounding the semiconductor pillar, the fifth interlayer insulating layer having an upper surface at a position lower than a lower surface of the first interlayer insulating layer in a perpendicular direction, and a semiconductor pillar side surface exposing step of exposing a side surface of the semiconductor pillar by forming a hole at the outer periphery of the semiconductor pillar by removing side surfaces of the fourth interlayer insulating layer, the gate conductor layer, and the gate insulating layer, the hole having a lower end at a position of the upper surface of the fifth interlayer insulating layer and an upper end at a position higher than an upper surface of the first interlayer insulating layer in the perpendicular direction. In the stacked material layers forming step, the stacked material layers are preferably formed by supplying a material atom of the first metal layer, the first semiconductor layer, the second interlayer insulating layer, the second metal layer, the second semiconductor layer, and the third interlayer insulating layer onto the fifth interlayer insulating layer in the direction perpendicular to the flat surface of the substrate. The alloy layer/semiconductor pillar side surface contact step and the inside-semiconductor-pillar alloy layer and impurity region forming step are preferably performed after the stacked material layers forming step. The method preferably further includes a fourth impurity region forming step of forming a fourth impurity region in the semiconductor pillar and above the second impurity region, the fourth impurity region having the same conductivity type as the second impurity region. The first impurity region, the third impurity region, a portion of the semiconductor pillar that lies between the first impurity region and the third impurity region, and the gate conductor layer preferably form a first surrounding gate MOS transistor in which the first impurity region and the third impurity region respectively function as a source and a drain or vice versa, the portion of the semiconductor pillar functions as a channel, and the gate conductor layer functions as a gate. The second impurity region, the fourth impurity region, a portion of the semiconductor pillar that lies between the second impurity region and the fourth impurity region, and the gate conductor layer preferably form a second surrounding gate MOS transistor in which the second impurity region and the fourth impurity region respectively function as a source and a drain or vice versa, the portion of the semiconductor pillar functions as a channel, and the gate conductor layer functions as a gate.

In the inside-semiconductor-pillar alloy layer and impurity region forming step, the first alloy layer and the second alloy layer are preferably expanded to reach a center of the semiconductor pillar in a plan view.

In the stacked material layers forming step, the first metal layer and a third semiconductor layer not containing donor or acceptor atoms are preferably formed, and donor or acceptor atoms are preferably ion-implanted into the third semiconductor layer to form the first semiconductor layer. Moreover, the second metal layer and a fourth semiconductor layer not containing donor or acceptor atoms are preferably formed on the second interlayer insulating layer, and donor or acceptor atoms are preferably ion-implanted into the fourth semiconductor layer to form the second semiconductor layer.

In the stacked material layers forming step, the first metal layer, a fifth semiconductor layer containing donor or acceptor atoms, the second interlayer insulating layer, the second metal layer, and a sixth semiconductor layer having the same conductivity type as the fifth semiconductor layer are preferably formed, and the first semiconductor layer and the second semiconductor layer are preferably formed by ion-implanting donor or acceptor atoms that generate a conductivity type different from that of the fifth semiconductor layer into one or both of the fifth semiconductor layer and the sixth semiconductor layer so that the amount of the donor or acceptor atoms implanted is larger than the amount of the donor or acceptor atoms contained in the fifth semiconductor layer.

The method preferably further includes a contact hole forming step of forming a contact hole that penetrates the second alloy layer and the second interlayer insulating layer and has a bottom that reaches an upper surface, inside, or a lower surface of the first alloy layer; and a wiring metal layer forming step of forming a wiring metal layer that fills the contact hole and electrically connects the first alloy layer and the second alloy layer.

The fourth impurity region is preferably formed so as to generate stress acting downward in the semiconductor pillar.

A space is preferably formed between the first alloy layer and the gate conductor layer and a space is preferably formed between the second alloy layer and the gate conductor layer.

According to the present invention, in an SGT-including semiconductor device that includes two SGTs formed in an upper portion and a lower portion of one semiconductor pillar and isolated from each other by an insulating layer at a central portion of the semiconductor pillar, semiconductor regions that are respectively formed under and above the insulating layer and respectively serve as a source and a drain of SGTs can be easily and accurately formed relative to the position of the gate conductor layers. Furthermore, according to the present invention, bending or collapsing of the semiconductor pillar that occurs in forming an alloy layer in a semiconductor region that lies in the central portion of the semiconductor pillar and serves as a source or a drain of an SGT can be suppressed, and the connection between the semiconductor region and a wiring metal layer connected to the alloy layer can be reliably established.

BRIEF DESCRIPTION OF THE DRAWINGS

FIG. 1AA is a plan view and FIGS. 1AB and 1AC are cross-sectional views showing a method for producing an SGT-including pillar-shaped semiconductor device according to a first embodiment of the present invention.

FIG. 1BA is a plan view and FIGS. 1BB and 1BC are cross-sectional views showing the method for producing an SGT-including pillar-shaped semiconductor device according to the first embodiment of the present invention.

FIG. 1EA is a plan view and FIGS. 1EB and 1EC are cross-sectional views showing the method for producing an SGT-including pillar-shaped semiconductor device according to the first embodiment of the present invention.

FIG. 1FA is a plan view and FIGS. 1FB and 1FC are cross-sectional views showing the method for producing an SGT-including pillar-shaped semiconductor device according to the first embodiment of the present invention.

FIG. 1GA is a plan view and FIGS. 1GB and 1GC are cross-sectional views showing the method for producing an SGT-including pillar-shaped semiconductor device according to the first embodiment of the present invention.

FIG. 1HA is a plan view, FIGS. 1HB and 1HC are cross-sectional views, and FIG. 1HD is an enlarged cross-sectional view showing the method for producing an SGT-including pillar-shaped semiconductor device according to the first embodiment of the present invention.

FIG. 1IA is a plan view, FIGS. 1IB and 1IC are cross-sectional views, and FIG. 1ID is an enlarged cross-sectional view showing the method for producing an SGT-including pillar-shaped semiconductor device according to the first embodiment of the present invention.

FIG. 1LA is a plan view and FIGS. 1LB and 1LC are cross-sectional views showing the method for producing an SGT-including pillar-shaped semiconductor device according to the first embodiment of the present invention.

FIG. 1MA is a plan view and FIGS. 1MB and 1MC are cross-sectional views showing the method for producing an SGT-including pillar-shaped semiconductor device according to the first embodiment of the present invention.

FIG. 1NA is a plan view and FIGS. 1NB and 1NC are cross-sectional views showing the method for producing an SGT-including pillar-shaped semiconductor device according to the first embodiment of the present invention.

FIG. 2AA is a plan view and FIGS. 2AB and 2AC are cross-sectional views showing a method for producing an SGT-including pillar-shaped semiconductor device according to a second embodiment of the present invention.

FIG. 2BA is a plan view and FIGS. 2BB and 2BC are cross-sectional views showing a method for producing an SGT-including pillar-shaped semiconductor device according to the second embodiment of the present invention.

FIG. 3AA is a plan view and FIGS. 3AB and 3AC are cross-sectional views showing a method for producing an SGT-including pillar-shaped semiconductor device according to a third embodiment of the present invention.

FIG. 3BA is a plan view and FIGS. 3BB and 3BC are cross-sectional views showing the method for producing an SGT-including pillar-shaped semiconductor device according to the third embodiment of the present invention.

FIG. 4A is a plan view and FIGS. 4B and 4C are cross-sectional views showing a method for producing an SGT-including pillar-shaped semiconductor device according to a fourth embodiment of the present invention.

FIG. 5A is a plan view and FIGS. 5B and 5C are cross-sectional views showing a method for producing an SGT-including pillar-shaped semiconductor device according to a fifth embodiment of the present invention.

FIG. 6A is a plan view and FIGS. 6B and 6C are cross-sectional views of a CMOS inverter circuit showing a method for producing an SGT-including semiconductor device according to a sixth embodiment of the present invention.

DETAILED DESCRIPTION OF THE PREFERRED EMBODIMENTS

Embodiments of a method for producing an SGT-including pillar-shaped semiconductor device according the present invention will now be described with reference to the drawings.

First Embodiment

A method for producing an SGT-including pillar-shaped semiconductor device according to a first embodiment of the present invention is described below with reference to FIGS. 1AA to 1NC.

FIGS. 1AA to 1AC show a first step of the method for producing an SGT-including pillar-shaped semiconductor device. FIG. 1AA is a plan view and FIGS. 1AB and 1AC are cross-sectional views respectively taken along line X-X' and line Y-Y' in FIG. 1AA. This relationship among the drawings equally applies to other drawings.

As shown in FIG. 1AA to 1AC, a $SiO_2$ layer (not shown) is formed on an i-layer substrate 1 by thermal oxidation. Lithography and reactive ion etching (RIE) are performed on the $SiO_2$ layer so as to form a $SiO_2$ layer 5a having a hole for oxygen ion ($O^+$) implantation. This hole may have a rectangular shape or circular shape in a plan view. Next, oxygen ions are implanted from the upper surface of the i-layer substrate 1 at an acceleration voltage of 100 to 200 KV and a dose of $2 \times 10^{18}/cm^2$, for example. Then a heat treatment is performed at, for example, 1150° C. to form a $SiO_2$ region 4 in the i-layer substrate 1 (refer to Hon Wai Lam: "SIMOX SOI for Integrated Circuit Fabrication", IEEE Circuit and Devices Magazine, pp. 6-11 (July 1987) for formation of the $SiO_2$ region 4, for example).

Next, as shown in FIGS. 1BA to 1BC, a $SiO_2$ layer 5b is deposited on the exposed portion of the i-layer substrate 1 and the $SiO_2$ layer 5a.

Figure 1C:
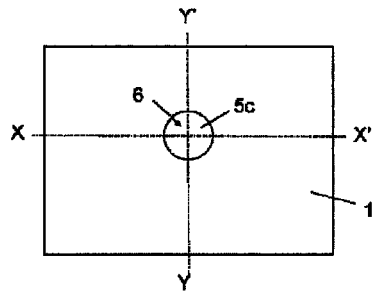
FIG. 1CA is a plan view and FIGS. 1CB and 1CC are cross-sectional views showing the method for producing an SGT-including pillar-shaped semiconductor device according to the first embodiment of the present invention.
Figure 1C:
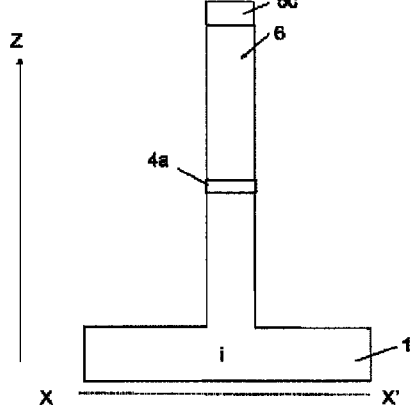
Figure 1C:
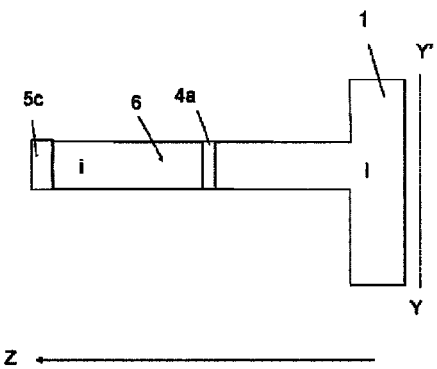

Next, as shown in FIGS. 1CA to 1CC, the $SiO_2$ layer 5b is etched by lithography and RIE so as to form a $SiO_2$ layer 5c. Then the i-layer substrate 1 is etched by RIE using the $SiO_2$ layer 5c as a mask so as to form a Si pillar 6 that extends in a direction perpendicular (vertical) to the surface of the i-layer substrate 1 and has an $SiO_2$ layer 4a in a center portion. The cross-sectional shape of the Si pillar 6 is preferably circular and is preferably smaller than the hole in the $SiO_2$ layer 5a as shown in FIG. 1CA. The angle formed between the side surface of the Si pillar 6 and the upper surface of the i-layer substrate 1 is preferably about 90°.

Figure 1D:
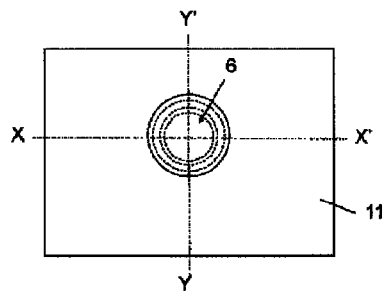
FIG. 1DA is a plan view and FIGS. 1DB and 1DC are cross-sectional views showing the method for producing an SGT-including pillar-shaped semiconductor device according to the first embodiment of the present invention.
Figure 1D:
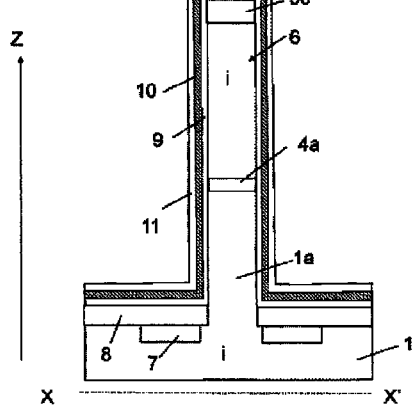
Figure 1D:
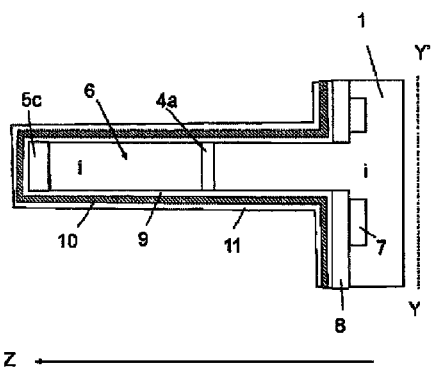

Next, as shown in FIGS. 1DA to 1DC, an $N^+$ region 7 is formed in an upper surface layer of the i-layer substrate 1 around the outer periphery of the Si pillar 6 by ion implantation. Then a $SiO_2$ film (not shown) is deposited by chemical vapor deposition (CVD), the upper surface of the $SiO_2$ film is planarized by mechanical chemical polishing (MCP), and the $SiO_2$ film is etched by an etch-back technique. As a result, a $SiO_2$ layer 8 remains on the $N^+$ region 7 and the i-layer substrate 1 around the outer periphery of the Si pillar 6. Then atomic layer deposition (ALD) is performed to cover the entire Si pillar 6 and $SiO_2$ layer 8 sequentially with a hafnium oxide ($HfO_2$) layer 9 and a titanium nitride (TiN) layer 10. CVD is performed to cover the Si pillar 6 and the entire area surrounding the Si pillar 6 with a $SiO_2$ layer 11. Eventually, the $HfO_2$ layer 9 serves as a gate insulating layer of an SGT and a TiN layer 10 serves as a gate conductor layer of an SGT.

Next, as shown in FIG. 1EA to 1EC, the $SiO_2$ layer 11 and the TiN layer 10 are etched by RIE using a resist formed by lithography as a mask. As a result, a $SiO_2$ layer 11a and a TiN layer 10a that cover the region from the upper surface of the Si pillar 6 to the upper surface of the $SiO_2$ layer 8 are formed.

Next, as shown in FIGS. 1FA to 1FC, a silicon nitride (SiN) layer 12a is formed around the outer periphery of the Si pillar 6. A resist layer 13 is then formed on the SiN layer 12a. The resist layer 13 is formed so that the $SiO_2$ layer 4a comes at a center portion of the resist layer 13. The resist layer 13 is formed by applying a resist material to the entire upper surface of the i-layer substrate 1, heat-treating the applied resist material at, for example, 200° C. to increase flowability of the resist material, and causing the resist material to homogeneously remain on the SiN layer 12a on the outer side of the Si pillar 6. Next, hydrogen fluoride gas (referred to as "HF gas" hereinafter) is supplied to the entire structure. Then a heating environment of 180° C., for example, is created to ionize the HF gas with moisture contained in the resist layer 13 and form hydrogen fluoride ions ($HF_2^+$) (referred to as "HF ions" hereinafter). The HF ions diffuse into the resist layer 13 and etch the $SiO_2$ layer 11a in contact with the resist layer 13 (refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979) for the mechanism of the etching here). The $SiO_2$ layer 11a not in contact with the resist layer 13 remains substantially unetched. Then the resist layer 13 is removed.

Through the process described above, the $SiO_2$ layer 11a is separated into a $SiO_2$ layer 11b in the region covered with the SiN layer 12a and a $SiO_2$ layer 11c in an upper region of the Si pillar 6, as shown in FIGS. 1GA to 1GC. The TiN layer 10a is etched by using the $SiO_2$ layer 11b and the $SiO_2$ layer 11c as a mask so that the TiN layer 10a is separated into a TiN layer 10b covered with the $SiO_2$ layer 11b in a lower region of the Si pillar 6 and a TiN layer 10c covered with the $SiO_2$ layer 11c in an upper region of the Si pillar 6. The $HfO_2$ layer 9 is then etched by using the $SiO_2$ layer 11b, the $SiO_2$ layer 11c, the TiN layer 10b, and the TiN layer 10c as a mask so that the $HfO_2$ layer 9 is separated into a $HfO_2$ layer 9a partly covered with the TiN layer 10b in a lower region of the Si pillar 6 and a $HfO_2$ layer 9b covered with the TiN layer 10c in an upper region of the Si pillar 6. As a result, an opening 30a is formed at the side surface of the Si pillar 6. Exposed portions of the TiN layer 10b and the TiN layer 10c are then oxidized to form a titanium oxide (TiO) layers 14a and 14b.

Next, as shown in FIGS. 1HA to 1HC, the As atoms in the $N^+$ region 7 are diffused into the i-layer substrate 1 by a heat treatment so as to form an $N^+$ region 7a. Then, for example, a substrate metal plate that holds the i-layer substrate 1 and a counter metal plate at a distance from the substrate metal plate are prepared, and DC voltage is applied to the substrate metal plate to apply radio frequency (RF) voltage to the two metal plates arranged in parallel and sputter a material atom of the counter metal plate onto the i-layer substrate 1 (bias sputtering technique). According to this bias sputtering technique, Ni atoms are supplied in a direction perpendicular to the upper surface of the i-layer substrate 1 so as to form a Ni layer 15a on the SiN layer 12a and a Ni layer 15c on the Si pillar 6. A poly-Si layer 16a containing arsenic (As) as an impurity is formed on the Ni layer 15a and a poly-Si layer 16c containing arsenic (As) atoms serving as a donor impurity is formed on the Ni layer 15c by the bias sputtering technique. The atoms of $SiO_2$ are then supplied in a direction perpendicular to the upper surface of the i-layer substrate 1 by the bias sputtering technique so as to form a $SiO_2$ layer 17a on the poly-Si layer 16a and a $SiO_2$ layer 17c on the poly-Si layer 16c. A Ni layer 15b, a poly-Si layer 16b containing boron (B) atoms serving as an acceptor impurity, and a $SiO_2$ layer 17b are formed on the $SiO_2$ layer 17a; and a Ni layer 15d, a poly-Si layer 16d containing boron (B) atoms, and a $SiO_2$ layer 17d are formed on the $SiO_2$ layer1 17c by the same methods as those of forming the Ni layer 15a, the poly-Si layer 16a, and the $SiO_2$ layer 17a.

Since the Ni atoms and the atoms of poly-Si and $SiO_2$ are supplied in a direction perpendicular to the upper surface of the i-layer substrate 1, a space 18 is created between the circumferential side surface of the Si pillar 6 and each of the Ni layer 15a, the Ni layer 15b, the poly-Si layer 16a, the poly-Si layer 16b, and the $SiO_2$ layer 17a.

FIG. 1HD is an enlarged view of the part marked by dotted frame A in FIG. 1HB. The upper surface of the $SiO_2$ layer 17b is formed so as to be above the position of the upper end of the space 18. Since the $SiO_2$ layer 17b is in contact with the $SiO_2$ layer 11c, an enclosed space 18 is created.

Next, as shown in FIGS. 1IA to 1IC, the Ni atoms in the Ni layers 15a and 15b are diffused into the poly-Si layer 16a and the poly-Si layer 16b by a heat treatment at, for example, 550° C. so as to form nickel silicide (NiSi) layers 20a and 20b. The NiSi layers 20a and 20b expand to have larger volumes than the poly-Si layer 16a and the poly-Si layer 16b (for this volume expansion, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the poly-Si layer 16a is sandwiched between the SiN layer 12a and the $SiO_2$ layer 17a and the poly-Si layer 16b is sandwiched between the $SiO_2$ layer 17a and the $SiO_2$ layer 17b, the NiSi layers 20a and 20b mainly protrude into the space 18. The As atoms contained in the poly-Si layer 16a and the B atoms contained in the poly-Si layer 16b are swept out from the NiSi layers 20a and 20b (for this sweep-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). During the process of forming the NiSi layers $20a$ and $20b$, due to this sweep-out of impurity atoms, protrusions $21a$ and $21b$ having higher impurity concentrations are formed at the side surface layers of the NiSi layers $20a$ and $20b$ protruding into the space 18. Side surfaces of the protrusions $21a$ and $21b$ contact the surface of the Si pillar 6. Subsequently, NiSi layers $20c$ and $20d$, protrusions $21c$ and $21d$, and $SiO_2$ layers $17c$ and $17d$ on the top of the Si pillar 6 are removed.

FIG. 1ID is an enlarged view of the part marked by dotted frame A in FIG. 1IB. The side surface of the protrusion $21a$ having a high donor impurity As concentration and the side surface of the protrusion $21b$ having a high acceptor impurity B concentration are in contact with the side surface of the Si pillar 6. The upper surface of the $SiO_2$ layer $17b$ is formed so as to be above the position of the upper end of the space 18. As a result, the NiSi layer $20a$ is sandwiched between the SiN layer $12a$ and the $SiO_2$ layer $17a$ and the NiSi layer $20b$ is sandwiched between the $SiO_2$ layer $17a$ and the $SiO_2$ layer $17b$.

Figure 1J:
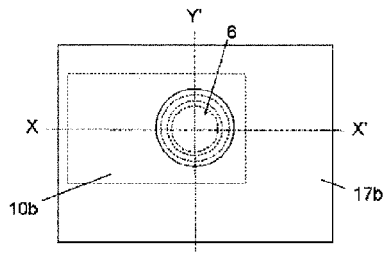
FIG. 1JA is a plan view and FIGS. 1JB and 1JC are cross-sectional views showing the method for producing an SGT-including pillar-shaped semiconductor device according to the first embodiment of the present invention.
Figure 1J:
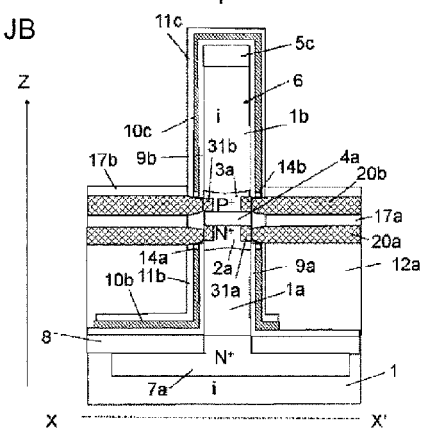
Figure 1J:
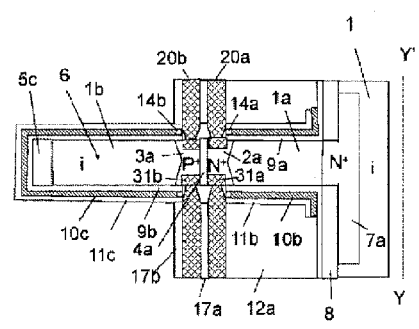

Next, as shown in FIGS. 1JA to 1JC, a heat treatment is conducted to expand silicidation of the NiSi layers $20a$ and $20b$ and diffuse the As atoms from the protrusion $21a$ and the B atoms from the protrusion $21b$ into the Si pillar 6 through the impurity sweep-out effect. NiSi layers $31a$ and $31b$ are thereby formed in the side surface layer of the Si pillar 6 in contact with the NiSi layers $20a$ and $20b$, and an $N^+$ region $2a$ and a $P^+$ region $3a$ are formed by diffusion of As atoms and B atoms into the Si pillar 6 through the impurity sweep-out effect. Since thermal diffusion of the donor and acceptor impurity atoms is suppressed and, at the same time, silicidation is suppressed by the $SiO_2$ region 4, the $N^+$ region $2a$ and the $P^+$ region $3a$ are separated from each other by the $SiO_2$ layer $4a$.

Figure 1K:
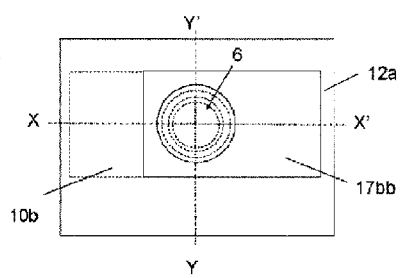
FIG. 1KA is a plan view and FIGS. 1KB and 1KC are cross-sectional views showing the method for producing an SGT-including pillar-shaped semiconductor device according to the first embodiment of the present invention.
Figure 1K:
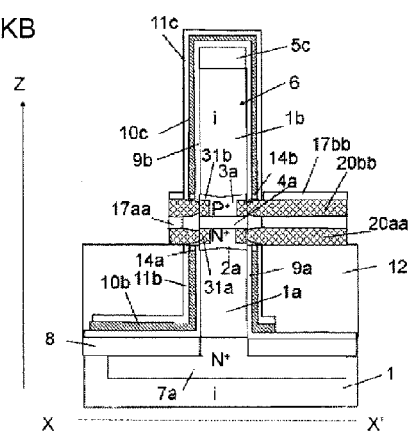
Figure 1K:
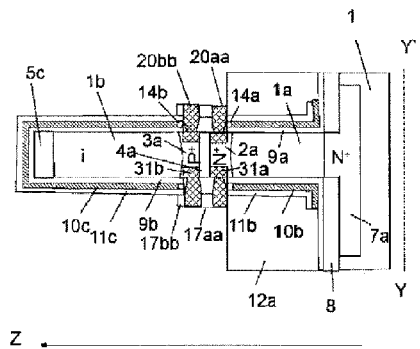
Figure 7:
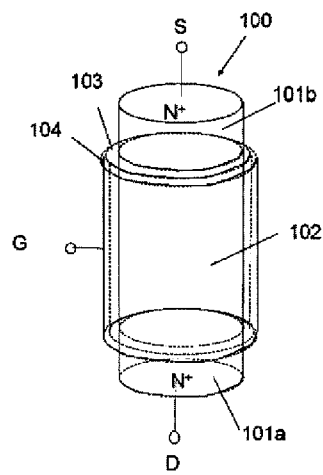
FIG. 7 is a schematic diagram showing an SGT of related art.
Figure 8:
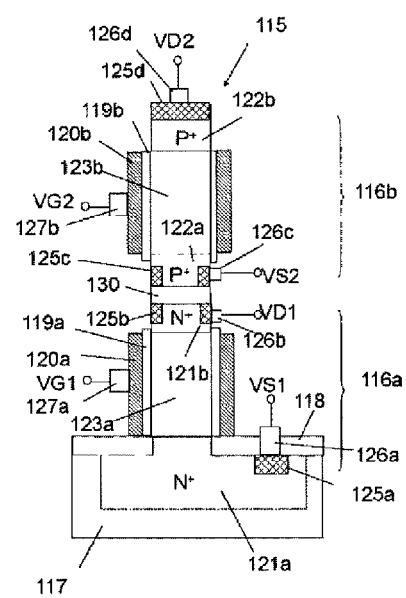
FIG. 8 is a schematic diagram of a circuit of related art in which an N-channel SGT and a P-channel SGT are respectively formed in a lower portion and an upper portion of a single Si pillar.

Next, as shown in FIGS. 1KA to 1KC, patterning is performed on the NiSi layers $20a$ and $20b$ and the $SiO_2$ layers $17a$ and $17b$ by lithography and RIE so as to form NiSi layers $20aa$ and $20bb$ and $SiO_2$ layers $17aa$ and $17bb$.

Next, as shown in FIGS. 1LA to 1LC, patterning is performed on the NiSi layer $20bb$ and the $SiO_2$ layer $17bb$ by lithography and RIE so as to form a NiSi layer $20bc$ and a $SiO_2$ layer $17bc$ that are receding in the X-X' axis direction toward the Si pillar 6 compared to the NiSi layer $20aa$ and the $SiO_2$ layer $17aa$.

Next, as shown in FIGS. 1MA to 1MC, a SiN layer $12b$ is formed so that the upper surface thereof comes at the middle of the TiN layer $10c$ in the height direction by using the same method as the method of forming the SiN layer $12a$. An opening $30b$ is formed at the outer periphery of the TiN layer $10c$ by the same method as that of forming the opening $30a$. A NiSi layer 22 in contact with the TiN layer $10c$ is then formed. A $SiO_2$ layer $12c$ is formed so that the upper surface thereof comes at a position higher than the surface of the NiSi layer 22 and lower than the top portion of the Si pillar 6. The $SiO_2$ layer $11c$, the TiN layer $10c$, and the $HfO_2$ layer $9b$ are etched by using the $SiO_2$ layer $12c$ as a mask so as to form a $SiO_2$ layer $11d$, a TiN layer $10d$, and a $HfO_2$ layer $9c$. A $P^+$ region 24 is formed in the top portion of the Si pillar 6 by boron ion implantation using the $SiO_2$ layer $11d$, the $SiO_2$ layer $12c$, the TiN layer $11d$, and the $HfO_2$ layer $9c$ as a mask.

Next, as shown in FIGS. 1NA to 1NC, a $SiO_2$ layer $12d$ is formed over the entire structure by CVD and MCP. Then lithography and RIE are performed so that a contact hole $28a$ penetrating the $SiO_2$ layer $12d$, the $SiO_2$ layer $12c$, the SiN layer $12b$, and the SiN layer $12a$ is formed on the TiN layer $10b$, a contact hole $28b$ penetrating the $SiO_2$ layer $12d$ and $SiO_2$ layer $12c$ is formed on the NiSi layer 22, a contact hole $28c$ penetrating the $SiO_2$ layer $12d$ is formed on the top portion of the Si pillar 6, a contact hole $28d$ penetrating the $SiO_2$ layer $12d$, the $SiO_2$ layer $12c$, the SiN layer $12b$, and a $SiO_2$ layer $17bc$ is formed on a NiSi layer $20bc$, a contact hole $28e$ penetrating the $SiO_2$ layer $12d$, the $SiO_2$ layer $12c$, the SiN layer $12b$, and the $SiO_2$ layer $17aa$ is formed on the NiSi layer $20aa$, and a contact hole $28f$ penetrating the $SiO_2$ layer $12d$, the $SiO_2$ layer $12c$, the SiN layer $12b$, the SiN layer $12a$, the $HfO_2$ layer $9a$, and the $SiO_2$ layer 8 is formed on the $N^+$ region $7a$. A gate wiring metal layer Vg1 electrically connected to the TiN layer $10b$ through the contact hole $28a$ is formed, a gate wiring metal layer Vg2 electrically connected to the NiSi layer 22 through the contact hole $28b$ is formed, and a drain wiring metal layer Vd2 electrically connected to the $P^+$ region 24 in the top portion of the Si pillar 6 through the contact hole $28c$ is formed. A source wiring metal layer Vs2 electrically connected to the NiSi layer $20bc$ through the contact hole $28d$ is formed, a drain wiring metal layer Vd1 electrically connected to the NiSi layer $20aa$ through the contact hole $28e$ is formed, and a source wiring metal layer Vs1 electrically connected to the $N^+$ region $7a$ through the contact hole $28f$ is formed. The NiSi layer $20aa$ and the NiSi layer $20bc$ are separated from each other by the space 18 and the $SiO_2$ layer $17aa$. Preferably, spaces remain between the NiSi layer $20aa$ and the TiO layer $14a$ and between the NiSi layer $20bc$ and the TiO layer $14b$. According to this structure, electrical insulation between the TiN layers $10b$ and 10D serving as gate conductor layers and the NiSi layers $20aa$ and $20bc$, respectively, is improved.

An N-channel SGT and a P-channel SGT are formed by the above-described production method, in which the N-channel SGT is constituted by an i-layer $1a$ (serving as a channel) in a lower portion of the Si pillar 6, the $HfO_2$ layer $9a$ (serving as a gate insulating layer) surrounding the outer periphery of the i-layer $1a$, the TiN layer $10b$ (serving as a gate conductor layer) surrounding the outer periphery of the $HfO_2$ layer $9a$, the $N^+$ region $7a$ (serving as a source) that lies under the i-layer $1a$, and the $N^+$ region $2a$ (serving as a drain) that lies above the i-layer $1a$, and the P-channel SGT is constituted by an i-layer $1b$ (serving as a channel) in an upper portion of the Si pillar 6, the $HfO_2$ layer $9c$ (serving as a gate insulating layer) surrounding the outer periphery of the i-layer $1b$, the TiN layer $10d$ (serving as a gate conductor layer) surrounding the outer periphery of the $HfO_2$ layer $9c$, the $P^+$ region $3a$ (serving as a source) that lies under the i-layer $1b$, and the $P^+$ region 24 (serving as a drain) that lies above the i-layer $1b$. The N-channel SGT and the P-channel SGT are isolated from each other by the $SiO_2$ layer $4a$. The drain $N^+$ region $2a$ of the N-channel SGT in the lower portion of the Si pillar 6 and the source $P^+$ region $3a$ of the P-channel SGT in the upper portion of the Si pillar 6 are electrically independent from each other and are respectively connected to the drain wiring metal layer Vd1 and the source wiring metal layer Vs2 for output.

In the description of this embodiment, an N-channel SGT is formed in a lower portion of the Si pillar 6 and a P-channel SGT is formed in an upper portion of the Si pillar 6. Alternatively, the channel types of the two SGTs can be changed to N-channel or P-channel depending on the choice of the donor or acceptor impurity contained in the poly-Si layers 16a and 16b shown in FIGS. 1HA to 1HC. If the channel type differs between the upper and lower SGTs, the gate TiN layers 10b and 10d may be formed of different gate conductor material layers depending on the threshold voltage each SGT requires. For example, in FIG. 1MB, the TiN layer 10d is etched away before forming the P$^+$ layer 24 and while the NiSi layer 22 is not yet caused to protrude. Then, for example, an ALD method is employed to bury the new gate conductor layer, the P$^+$ layer 24 is formed, and the NiSi layer 22 is caused to protrude.

In the step shown in FIGS. 1IA to 1IC, the NiSi layers 20a and 20b are allowed to expand into the space 18 and the protrusions 21a and 21b having a high donor or acceptor impurity concentration are connected to the side surface of the Si pillar 6; alternatively, these processes may be conducted in any of the subsequent steps as long as the structure shown in FIGS. 1NA to 1NC is obtained in the final step.

Similarly, in the step shown in FIGS. 1IA to 1IC, the NiSi layers 31a and 31b, the N$^+$ region 2a, and the P$^+$ region 3a are formed by performing a heat treatment once. However, the N$^+$ region 2a and the P$^+$ region 3a need not be formed in one heat treatment. The NiSi layers 31a and 31b, the N$^+$ region 2a, and the P$^+$ region 3a may be formed by performing a heat treatment two or more times in any of the steps shown in FIGS. 1IA to 1LA before the final step of producing the SGTs.

The method for producing the pillar-shaped semiconductor device according to the first embodiment has the following advantageous effects:

1. As shown in FIGS. 1NA to 1NC, two SGTs that are electrically independent from each other and isolated by the SiO$_2$ layer 4a and the SiO$_2$ layer 17aa are respectively formed in an upper portion and a lower portion of the Si pillar 6. The channel types of the two SGTs may be independently designed according to the circuit design and may be N-channel or P-channel. Thus, a high-density SGT circuit can be obtained.

2. As shown in FIGS. 1JA to 1JC, the N$^+$ region 2a is formed by diffusion of donor impurity As atoms from the source, which is the NiSi layer 20a whose lower end is positioned at the upper end of the TiN layer 10b serving as a gate of a lower SGT. As a result, in the lower SGT, the drain N$^+$ region 2a and the gate TiN layer 10b are formed by self-alignment. Similarly, the P$^+$ region 3a is formed by diffusion of the acceptor impurity B atoms from the source, which is the NiSi layer 20b whose upper surface is positioned at the lower end of the TiN layer 10c serving as a gate of the upper SGT. As a result, in the upper SGT, the drain P$^+$ region 3a and the gate TiN layer 10c are formed by self-alignment. The two drains, namely, N$^+$ region 2a and P$^+$ region 3a, and the gate TiN layers 10b and 10c are formed by self-alignment simultaneously. This will decrease variation in properties of SGTs and lower the capacitance between the drain N$^+$ region 2a and the gate TiN layer 10b and between the drain P$^+$ region 3a and the gate TiN layer 10c.

3. The drain N$^+$ region 2a and the drain P$^+$ region 3a are formed simultaneously, not separately. This decreases the cost for producing integrated circuits (ICs) with SGT circuits. Since the N$^+$ region 2a and the P$^+$ region 3a can be formed at high positional accuracy, circuits with less variation in properties can be formed.

4. The NiSi layers 20a and 20b which are the sources of impurities for forming the drain N$^+$ region 2a and the drain P$^+$ region 3a also serve as extraction wiring material layers for the drain N$^+$ region 2a and the drain P$^+$ region 3a. This decreases the cost for producing ICs with SGTs.

5. The NiSi layers 20a, 20b, 20aa, and 20bb remain during the steps of forming the NiSi layers 31a and 31b and steps subsequent thereto. The NiSi layers 20a, 20b, 20aa, and 20bb support the Si pillar 6 and prevent collapsing or bending of the Si pillar 6.

6. In FIGS. 1NA to 1NC, spaces remain between the NiSi layer 20aa and the TiO layer 14a and between the NiSi layer 20bc and the TiO layer 14b. Thus, electrical insulation between the gate TiN layer 10b and the NiSi layer 20aa and between the gate TiN layer 10d and the NiSi layer 20bc is improved.

Second Embodiment

A method for producing an SGT-including pillar-shaped semiconductor device according to a second embodiment of the present invention will now be described with reference to FIGS. 2AA to 2BC. The method of the second embodiment includes the same steps as those shown in FIGS. 1AA to 1NC of the first embodiment except for the structural differences described below.

After the steps shown in FIGS. 1AA to 1GC are performed, material atoms are supplied by sputtering in a direction perpendicular to the surface of the i-layer substrate 1 as shown in FIGS. 2AA to 2AC so as to deposit a Ni layer 15a, an impurity-atom-free poly-Si layer 29a, and a SiO$_2$ layer 17a on the SiN layer 12a. Then As atoms are implanted into the poly-Si layer 29a by ion implantation.

Next, as shown in FIGS. 2BA to 2BC, material atoms are supplied by sputtering in a direction perpendicular to the surface of the i-layer substrate 1 so as to deposit a Ni layer 15b, an impurity-atom-free poly-Si layer 29b, and a SiO$_2$ layer 17b on the SiO$_2$ layer 17a. Then B atoms are implanted into the poly-Si layer 29b by ion implantation. As a result, a poly-Si layer 29a containing donor impurity As atoms and a poly-Si layer 29b containing acceptor impurity B atoms are formed as in FIGS. 1HA to 1HD.

In this embodiment, donor and acceptor impurity atoms are introduced into the poly-Si layers 29a and 29b through ion implantation. Thus, in the case where two or more Si pillars (not shown) identical to the Si pillar 6 are to be formed on the i-layer substrate 1 and SGTs are to be formed in upper and/or lower portions of each of these Si pillars, N-channel or P-channel SGTs can be easily formed in upper and lower portions of each Si pillar according to the circuit design by lithography and ion implantation.

Third Embodiment

A method for producing an SGT-including pillar-shaped semiconductor device according to a third embodiment of the present invention will now be described with reference to FIGS. 3AA to 3BC. The method of the third embodiment includes the same steps as those shown in FIGS. 1AA to 1NC of the first embodiment except for the structural differences described below.

In the same step as the step shown in FIGS. 1HA to 1HD, material atoms are supplied in a direction perpendicular to the upper surface of the i-layer substrate 1 by a bias sputtering technique as shown in FIGS. 3AA to 3AC so as to form a Ni layer 15a, an N-type poly-Si layer 29aa containing arsenic (As) as an impurity, a SiO$_2$ layer 17a, a Ni layer 15b, an N-type poly-Si layer 29bb containing arsenic (As) as an impurity, and a SiO$_2$ layer 17b on the SiN layer 12a.

Next, as shown in FIGS. 3BA to 3BC, B atoms serving as an acceptor impurity are implanted into the poly-Si layer 29bb so that the acceptor impurity concentration thereof is higher than the already-contained donor impurity concentration of the poly-Si layer 29bb. As a result, a P-type poly-Si layer 29bb is formed. Then the steps shown in FIGS. 1IA to 1NC are performed.

In the step shown in FIGS. 3BA to 3BC, the acceleration voltage for B ion implantation is controlled so that, for example, the implanted B atom distribution peaks at the lower poly-Si layer 29aa. As a result, the poly-Si layer 29aa becomes P-type and the poly-Si layer 29bb becomes N-type. Alternatively, in the step shown in FIGS. 3BA to 3BC, the implanted B atom distribution may be controlled to peak at the $SiO_2$ layer 17a and about the same amount of B atoms may be implanted into the poly-Si layers 29aa and 29bb so that both of the poly-Si layers 29aa and 29bb are P-type. Both the poly-Si layers 29aa and 29bb can be P-type if B ion implantation is not performed. Accordingly, N-channel or P-channel SGTs can be easily formed by lithography and ion implantation in upper portions and lower portions of the Si pillars depending on the circuit design. In the third embodiment, the ion implantation step can be cut half compared to the second embodiment.

Fourth Embodiment

An SGT-including pillar-shaped semiconductor device according to a fourth embodiment of the present invention will now be described with reference to FIGS. 4A to 4C.

As shown in FIGS. 4A to 4C, a $Si_{1-x}Ge_x$ layer 33 (for example, x=0.17) containing acceptor atoms is formed in the top portion of the Si pillar 6. The $Si_{1-x}Ge_x$ layer 33 serves as the drain layer of the P-channel SGT and corresponds to the P⁺ region 24 in FIGS. 1LA to 1LC. The $Si_{1-x}Ge_x$ layer 33 generates stress that acts downward from the $Si_{1-x}Ge_x$ layer 33 in the Si pillar 6 due to the difference in Si lattice spacing from the Si pillar 6. The P⁺ region 3a at the middle of the Si pillar 6 receives compression stress from the NiSi layers 20aa and 20bc protruding to be connected to the outer periphery of the Si pillar 6. This compression stress has a stress component that acts upward from the P⁺ region 3a in the Si pillar 6.

According to the fourth embodiment, the channel i-layer 1b of the P-channel SGT in the Si pillar 6 is sandwiched between the $Si_{1-x}Ge_x$ layer 33 and the P⁺ region 3a and receives compressive stress from the $Si_{1-x}Ge_x$ layer 33 and the P⁺ region 3a. As a result, hole mobility is improved and current driving performance of the P-channel SGT can be enhanced (for the increase in hole mobility of a P-channel MOS transistor caused by compressive stress, refer to S. E. Thompson, G. Sun, Y. S. Choi, and T. Nishida: "Uniaxial-Process-Induced Strained-Si: Extending the CMOS Roadmap", IEEE Transaction on Electron Devices, Vol. 53, No. 5, pp. 1010-1020 (1995), for example).

Fifth Embodiment

An SGT-including pillar-shaped semiconductor device according to a fifth embodiment of the present invention will now be described with reference to FIGS. 5A to 5C.

As shown in FIGS. 5A to 5C, NiSi layers 31c and 31d that extend from the side surfaces of the NiSi layer 20aa and NiSi layer 20bc to the cross-sectional center are formed in the N⁺ region 2a and the P⁺ region 3a in the Si pillar 6 by silicidation. The NiSi layers 31c and 31d are isolated from each other by the $SiO_2$ layer 4a.

In FIGS. 1LA to 1LC, the NiSi layers 31a and 31b are formed in the surface layer of the side surface of the Si pillar 6. Instead, in the fifth embodiment, the NiSi layers 31c and 31d corresponding to the NiSi layers 31a and 31b are formed by siliciding the corresponding parts of the Si pillar 6 to the cross-sectional center. According to the fifth embodiment, collapsing or bending of the Si pillar 6 caused by formation of NiSi layers 31c and 31d having different expansion coefficients in the entire cross-section of the Si pillar 6 can be prevented since the NiSi layer 20aa and the NiSi layer 20bc surrounding the outer peripheries of the NiSi layers 31c and 31d remain unremoved. This is particularly effective when the cross-sectional diameter of the Si pillar 6 is small. Moreover, when this structure is applied to the fourth embodiment, the stress acting upward from the NiSi layer 31d can be increased compared to when the NiSi layers 31a and 31b are formed along the outer periphery of the Si pillar 6 as shown in FIGS. 4A to 4C. According to this structure, the hole mobility is improved and the current driving performance of the P-channel SGT can be further enhanced.

Sixth Embodiment

An SGT-including CMOS inverter circuit according to a sixth embodiment of the present invention will now be described with reference to FIGS. 6A to 6C.

As shown in FIGS. 6A to 6C, a NiSi layer 31c connected to the N⁺ region 2a is formed in the Si pillar 6. A NiSi layer 20aa connected to the NiSi layer 31c surrounds the Si pillar 6. A NiSi layer 31d connected to the P⁺ region 3a is formed in the Si pillar 6. A NiSi layer 20bb connected to the NiSi layer 31d surrounds the Si pillar 6. The NiSi layer 20aa, the $SiO_2$ layer 17aa, the NiSi layer 20bb, and the $SiO_2$ layer 17bb have the same shape in a plan view. A contact hole 28c penetrating the $SiO_2$ layer 12d, the $SiO_2$ layer 12c, the SiN layer 12b, the NiSi layer 20aa, the $SiO_2$ layer 17aa, the NiSi layer 20bb, and the $SiO_2$ layer 17bb is formed on the SiN layer 12a (the bottom of the contact hole 28c may come at the upper surface or the middle portion of the NiSi layer 20aa). A NiSi layer 22a connected to the TiN layer 10d has the same shape as the TiN layer 10b in a plan view. A contact hole 28a penetrating the $SiO_2$ layer 12d, the $SiO_2$ layer 12c, the NiSi layer 22a, the SiN layer 12b, and the SiN layer 12a is formed on the TiN layer 10b. Then an input wiring metal layer Vin is formed through the contact hole 28a, a power source wiring metal layer Vdd is formed through the contact hole 28b, an output wiring metal layer Vout is formed through the contact hole 28c, and an earth wiring metal layer Vss is formed through the contact hole 28d. The NiSi layers 20aa and 20bb are electrically connected to each other via the output wiring metal layer Vout. The NiSi layer 22a and the TiN layer 10b are electrically connected to each other via the input wiring metal layer Vin. The NiSi layer 22a and the TiN layer 10b are electrically connected to each other via the input wiring metal layer Vin. As a result, a CMOS inverter circuit that includes an N-channel SGT in a lower portion of the Si pillar 6 and a P-type SGT in an upper portion of the Si pillar 6 is obtained.

As described above, a contact hole 28c that penetrates the NiSi layers 20aa and 20bb is formed and an output wiring metal layer Vout is formed through this contact hole 28c. According to this structure, the NiSi layers 20aa and 20bb electrically isolated by the $SiO_2$ layer 17aa come to be connected to each other through one contact hole 28c in a plan view. Thus, the area occupied by the SGT-including CMOS inverter circuit on the i-layer substrate can be decreased.

In the first embodiment, the material atoms are supplied in a direction perpendicular to the upper surface of the i-layer substrate 1 by a bias sputtering technique so as to form the Ni layer 15a, the Ni layer 15b, the poly-Si layer 16a, the poly-Si layer 16b, the $SiO_2$ layer 17a, and the $SiO_2$ layer 17b. Any technique other than the bias sputtering technique can be employed as long as the material atoms can be supplied in a direction perpendicular to the upper surface of the i-layer substrate 1. This also applies to other embodiments of the present invention.

In the first embodiment, the NiSi layers 20a and 20b are cause to protrude into the space 18 by silicidation of the poly-Si layer 16a and the poly-Si layer 16b. Layers of other metals, such as titanium (Ti) and cobalt (Co), may be used instead or the Ni layer 15a and the Ni layer 15b so as to allow the silicide layers to protrude into the space 18. This also applies to other embodiments of the present invention.

In the first embodiment, the Ni layer 15a and the Ni layer 15b are formed as lower layers and the poly-Si layer 16a and the poly-Si layer 16b containing a donor or acceptor impurity are formed as upper layers. Alternatively, the Ni layer 15a and the Ni layer 15b may be formed as upper layers and the poly-Si layer 16a and the poly-Si layer 16b containing a donor or acceptor impurity may be formed as lower layers. This also applies to other embodiments of the present invention.

In the first embodiment, the NiSi layer 20a is formed by heat-treating previously formed two layers, i.e., the Ni layer 15a and the poly-Si layer 16a thereon, and the NiSi layer 20b is formed by heat-treating previously formed two layers, i.e., the Ni layer 15b and the poly-Si layer 16b. However, the position of the Ni layer 15a may be under or above the poly-Si layer 16a and the position of the Ni layer 15b may be under or above the poly-Si layer 16b. Alternatively, the NiSi layers 20a and 20b may each be formed from two or more Ni layers and two or more poly-Si layers. This also applies to other embodiments of the present invention.

In the first embodiment, the Si pillar 6 is formed so that the angle formed between the side surface of the Si pillar 6 and the upper surface of the i-layer substrate 1 is about 90°, and the material atoms are supplied in a direction perpendicular to the upper surface of the i-layer substrate 1 by a bias sputtering technique so as to form Ni layers 15a and 15b, poly-Si layers 16a and 16b, and $SiO_2$ layers 17a and 17b. In the first embodiment, the angle between the side surface of the Si pillar 6 and the upper surface of the i-layer substrate 1 is adjusted to about 90° so as to prevent deposition of Ni, Si, and $SiO_2$ material atoms onto the side surface of the $SiO_2$ layer 11c surrounding the outer periphery of the Si pillar 6. This angle of the side surface of the Si pillar 6 may be smaller than 90° as long as the Ni, Si, and $SiO_2$ material atoms are prevented from depositing onto the side surface of the $SiO_2$ layer 1c surrounding the outer periphery of the Si pillar 6. For example, in the bias sputtering technique, deposition of the Ni, Si, and $SiO_2$ material atoms onto the side surface of the $SiO_2$ layer 1c can be prevented by controlling the bias voltage applied between the substrate electrode plate holding the i-layer substrate 1 and the counter electrode plate at a distance from the i-layer substrate 1 (for the basic procedure thereof, refer to C. Y. Ting, V. J. Vivalda, and H. G. Schaefer: "Study of planarized sputter-deposited $SiO_2$," J. Vac. Sci. Technol, 15(3), May/June (1978)). Deposition of the Ni, Si, and $SiO_2$ material atoms onto the side surface of the $SiO_2$ layer 11c poses no problem as long as the deposits can be easily etched away with a diluted hydrofluoric acid solution or the like. This also applies to other embodiments of the present invention.

In the first embodiment, a heat treatment shown in FIGS. 1JA to 1JC is performed to form the connections between the side surface of the Si pillar 6 and the NiSi layer 20a and between the side surface of the Si pillar 6 and the NiSi layer 20b, and to form the NiSi layers 31a and 31b, the $N^+$ region 2a, and the $P^+$ region 3a in the Si pillar 6. However, forming the connections between the side surface of the Si pillar 6 and the NiSi layer 20a and between the side surface of the Si pillar 6 and the NiSi layer 20b, and forming the NiSi layers 31a and 31b, the $N^+$ region 2a, and the $P^+$ region 3a in the Si pillar 6 may be conducted in any step up to and including the final step of producing the SGTs. This also applies to other embodiments of the present invention.

Although the poly-Si layers 16a and 16b are used in the first embodiment, amorphous layers may be used instead. This also applies to other embodiments.

In the first embodiment, the layer 12a and the layer 12b are each composed of the same material, SiN. Alternatively, the lower layer (12a) may be a $SiO_2$ layer and the upper layer may (12b) be a SiN layer. Insulating material layers having a small HF ion diffusion coefficient may be used instead of the SiN layers 12a and 12b. This also applies to other embodiments of the present invention.

In the fifth embodiment, the Si pillar 6 is silicided to the cross-sectional center so as to form the NiSi layers 31c and 31d. This can also be applied to other embodiments of the present invention since operation of SGTs are not adversely affected thereby.

In the embodiments described above, a silicon (Si) pillar is used as the semiconductor pillar. The semiconductor pillar is not limited to a silicon pillar and the technical idea of the present invention is also applicable to other SGT-including semiconductor devices in which semiconductor pillars entirely or partly composed of semiconductor materials other than silicon are used.

In the embodiments described above, a method for producing a semiconductor device having two SGTs in one Si pillar is described. However, the method is not limited to this and the technical idea of the present invention can also be applied to a method for producing an SGT-including semiconductor device having one SGT in one semiconductor pillar or three or more SGTs in one semiconductor pillar.

In the first embodiment, an N-channel SGT is formed in a lower portion of the Si pillar 6 and a P-channel SGT is formed in an upper portion of the Si pillar 6. The technical idea of the present invention is also applicable to a circuit in which a P-channel SGT is formed in a lower portion and an N-channel SGT is formed in an upper portion. Furthermore, the technical idea of the present invention is also applicable to formation of a circuit in which two SGTs in an upper portion and a lower portion of a semiconductor pillar are both N-channel type or P-channel type. This also applies to other embodiments of the present invention.

In the embodiments described above, an SGT has a structure in which a $HfO_2$ layer (gate insulating layer) 9c is formed on the outer periphery of a semiconductor pillar such as the Si pillar 6 and a TiN layer (gate conductor layer) 10d is formed on the outer periphery of the $HfO_2$ layer 9c. However, the structure is not limited to this. Since a non-volatile memory element that has an electrically floating conductor layer between a gate insulating layer and a gate conductor layer or a charge storing layer such as a SiN layer is also one type of SGTs, the technical idea of the present invention is applicable to such non-volatile memory elements. In this case, a $SiO_2$ layer is preferably used as the tunneling oxide film instead or the $HfO_2$ layer.

In the first embodiment, the gate insulating layer is a HfO$_2$ layer. However, the gate insulating layer may be a single layer or a multilayer composed of any other insulating material.

The technical ideas of the present invention expressed in the embodiments described above are applicable to other semiconductor devices such as circuits, apparatuses, and elements.

In the first embodiment, the TiN layer 10b and the TiN layer 10d function as gate conductor layers. Alternatively, the gate conductor layer may be composed of any other metal material. The gate conductor may have a multilayer structure constituted by a metal layer, and, for example, a poly-Si layer. The impurity regions may be constituted by impurity layers that have different conductivity types as in the case of the N$^+$ region 2a and the P$^+$ region 3a, or impurity layers of the same conductivity type. If the impurity regions are constituted by impurity layers of the same conductivity type, the two impurity layers as a whole constitute one impurity region of the same conductivity type. If the impurity regions have different conductivity types, the two impurity layers still constitute one impurity region as a whole. This structure is also applicable to other embodiments of the present invention.

In the first embodiment, in FIGS. 1FA to 1FC, after the opening 30a is formed at the side surface of the Si pillar 6, exposed portions of the TiN layer 10b and the TiN layer 10c are oxidized to form the insulating TiO layers 14a and 14b. Since the TiO layers 14a and 14b are formed by oxidizing the TiN layers 10b and 10c, N atoms are contained in the TiO layers 14a and 14b. Accordingly, the TiO layers 14a and 14b may be insulating layers containing N atoms. This also applies to other embodiments of the present invention.

In the first embodiment, the insulating TiO layers 14a and 14b may be omitted if spaces are formed between the NiSi layer 20aa and the TiN layer (gate conductor layer) 10b and between the NiSi layer 20bc and the Tian layer (gate conductor layer) 10d. This also applies to other embodiments of the present invention.

In the first embodiment, in FIGS. 1FA to 1FC, after the opening 30a is formed at the side surface of the Si pillar 6, exposed portions of the TiN layer 10b and the TiN layer 10c are oxidized to form the insulating TiO layers 14a and 14b. Instead of the insulating TiO layers 14a and 14b, other insulating layers such as SiO$_2$ layers may be formed. For example, an insulating layer such as a SiO$_2$ film may be formed so as to cover the entire Si pillar 6 by an ALD method in the step shown in FIGS. 1FA to 1FC and then an opening may be formed by the same method as that of forming the opening 30a shown in FIGS. 1EA to 1EC while covering the exposed portions of the TiN layer 10b and the TiN layer 10c with the insulating layer such as the SiO$_2$ layer.

In the embodiments described above, a silicon-on-insulator (SOI) substrate may be used instead of the i-layer substrate 1 and the SiO$_2$ layer of the SOI substrate may be used as the SiO$_2$ region 4 in FIGS. 1BA to 1BC. In such a case, the same SiO$_2$ layer as the SiO$_2$ layer 4a is formed in other Si pillars on the i-layer substrate 1. This also applies to other embodiments of the present invention.

In the first embodiment, the N$^+$ region 2a and the P$^+$ region 3a is isolated by the SiO$_2$ layer 4a. However, the technical idea of the present invention is applicable to the cases in which other insulating material layers are formed. This also applies to other embodiments.

In the step shown in FIGS. 1BA to 1BC of the first embodiment, the SiO$_2$ layer 5b is deposited on the exposed portion of the i-layer substrate 1 and the SiO$_2$ layer 5a. Alternatively, the SiO$_2$ layer 5b may be any other insulating layer such as a SiN layer. This also applies to other embodiments of the present invention.

In the fifth embodiment, the Si$_{1-x}$Ge$_x$ layer 33 that generates stress acting downward in the Si pillar 6 is formed in the top portion of the Si pillar 6. However, the layer 33 may be composed of any other material that can generate stress acting downward in the Si pillar 6 and serve as a source or drain of a P-channel SGT.

In the first embodiment, one or both of the two SGTs formed in upper and lower portions of the Si pillar 6 may be tunneling SGTs operated by a tunneling phenomenon in which the source current and drain current flow between the N$^+$ region 2a and the N$^+$ region 7a and between the P$^+$ region 3a and the P$^+$ region 24 due to the voltage applied to the gate conductor layer. This also applies to other embodiments of the present invention.

Various modifications and alternations are possible without departing from the broad spirit and scope of the present invention. The embodiments described herein are merely illustrative and do not limit the scope of the present invention. The embodiments and modifications can be freely combined. Omitting some of the constitutional features of the above-described embodiments as needed also falls within the scope of the technical idea of the present invention.

What is claimed is:

1. A pillar-shaped semiconductor device comprising:
   a semiconductor pillar standing on a substrate in a direction perpendicular to a flat surface of the substrate;
   a first interlayer insulating layer in the semiconductor pillar;
   a first impurity region containing donor or acceptor atoms, the first impurity region in the semiconductor pillar in contact with the first interlayer insulating layer and under the first interlayer insulating layer;
   a second impurity region containing donor or acceptor atoms, the second impurity region being in the semiconductor pillar in contact with the first interlayer insulating layer and above the first interlayer insulating layer;
   a first alloy layer in the semiconductor pillar and around an outer periphery of the semiconductor pillar, the first alloy layer in contact with a side surface of the first impurity region;
   a second alloy layer in the semiconductor pillar and around the outer periphery of the semiconductor pillar, the second alloy layer in contact with a side surface of the second impurity region; and
   a second interlayer insulating layer between the first alloy layer and the second alloy layer and having a side surface at a distance from a side surface of the semiconductor pillar.

2. The pillar-shaped semiconductor device according to claim 1, further comprising:
   a gate insulating layer surrounding the semiconductor pillar;
   a gate conductor layer surrounding the gate insulating layer;
   a third impurity region at a bottom of the semiconductor pillar, the third impurity region having the same conductivity type as the first impurity region;
   a fourth impurity region in the semiconductor pillar above the second impurity region, the fourth impurity region having the same conductivity type as the second impurity region;

a third interlayer insulating layer in contact with a lower surface of the first alloy layer; and a fourth interlayer insulating layer in contact with an upper surface of the second alloy layer, wherein the first impurity region, the third impurity region, a portion of the semiconductor pillar that lies between the first impurity region and the third impurity region, and the gate conductor layer comprise a first surrounding gate MOS transistor in which the first impurity region and the third impurity region respectively function as a source and a drain or vice versa, the portion of the semiconductor pillar functions as a channel, and the gate conductor layer functions as a gate, and the second impurity region, the fourth impurity region, a portion of the semiconductor pillar that lies between the second impurity region and the fourth impurity region, and the gate conductor layer comprise a second surrounding gate MOS transistor in which the second impurity region and the fourth impurity region respectively function as a source and a drain or vice versa, the portion of the semiconductor pillar functions as a channel, and the gate conductor layer functions as a gate.

3. The pillar-shaped semiconductor device according to claim 2, wherein stress acts in the semiconductor pillar downward from the fourth impurity region.

4. The pillar-shaped semiconductor device according to claim 2, wherein the first alloy layer and the gate conductor layer are separated and the second alloy layer and the gate conductor layer are separated.

5. The pillar-shaped semiconductor device according to claim 2, wherein one of the first surround gate MOS transistor and the second surround gate MOS transistor is an N-channel transistor while the other is a P-channel transistor, and the gate conductor layer of the first transistor comprises a different material than the gate conductor layer of the second transistor.

6. The pillar-shaped semiconductor device according to claim 1, wherein each of the first alloy layer and the second alloy layer extend to a center of the semiconductor pillar in a plan view.

7. The pillar-shaped semiconductor device according to claim 1, wherein the first alloy layer and the second alloy layer function as wiring conductor material layers.

8. The pillar-shaped semiconductor device according to claim 1, wherein the first alloy layer and the second alloy layer are connected to a wiring metal layer through a contact hole that penetrates the second alloy layer and the second interlayer insulating layer and has a bottom that extends to an upper surface, inside, or a lower surface of the first alloy layer, the wiring metal layer being disposed above the contact hole.

9. The pillar-shaped semiconductor device according to claim 1, wherein the first alloy layer contains the same donor or acceptor atom as contained in the first impurity region, and the second alloy layer contains the same donor or acceptor atom as contained in the second impurity region.

10. The pillar-shaped semiconductor device according to claim 1, wherein a side surface of the semiconductor pillar facing a side surface of the second interlayer insulating layer is separated from the side surface of the second interlayer insulating layer, and the first alloy layer and the second alloy layer are separated from each other between the side surface of the semiconductor pillar and the side surface of the second interlayer insulating layer.

11. A method for producing a pillar-shaped semiconductor device, the method comprising:

a first step of forming a semiconductor pillar that stands on a substrate in a direction perpendicular to a flat surface of the substrate, the semiconductor pillar having a first interlayer insulating layer inside;

a second step of forming stacked material layers in a direction perpendicular to the flat surface of the substrate so as to form, in a peripheral region surrounding the semiconductor pillar and at a distance from a side surface of the semiconductor pillar, a first metal layer, a first semiconductor layer containing donor or acceptor atoms, a second interlayer insulating layer at the same height as the first interlayer insulating layer in a perpendicular direction, a second metal layer, a second semiconductor layer containing donor or acceptor atoms, and a third interlayer insulating layer;

a third step of performing a heat treatment to form a first alloy layer by a reaction between the first metal layer and the first semiconductor layer and to form a second alloy layer by a reaction between the second metal layer and the second semiconductor layer;

a fourth step of performing a heat treatment to cause the first alloy layer and the second alloy layer to protrude toward the side surface of the semiconductor pillar and bring the first alloy layer and the second alloy layer into contact with the side surface of the semiconductor pillar; and after the fourth step, a fifth step of performing a heat treatment to cause a reaction between metal atoms in the first alloy layer and the second alloy layer and semiconductor atoms in the semiconductor pillar so as to expand the first alloy layer and the second alloy layer to reach inside the semiconductor pillar, and to diffuse the donor or acceptor atoms swept out from the first alloy layer and the second alloy layer into the semiconductor pillar so as to form, inside the semiconductor pillar, a first impurity region containing the donor or acceptor atoms and contacting the first alloy layer and a second impurity region containing the donor or acceptor atoms and contacting the second alloy layer.

12. The method according to claim 11, wherein:

the method further comprises performing, after the first step, forming a gate insulating layer surrounding the semiconductor pillar, forming a gate conductor layer surrounding the gate insulating layer, forming a fourth interlayer insulating layer surrounding the gate conductor layer, forming a third impurity region at a bottom of the semiconductor pillar, the third impurity region containing donor or acceptor atoms, forming a fifth interlayer insulating layer in the peripheral region surrounding the semiconductor pillar, the fifth interlayer insulating layer having an upper surface at a position lower than a lower surface of the first interlayer insulating layer in a perpendicular direction, and exposing a side surface of the semiconductor pillar by forming a hole at the outer periphery of the semiconductor pillar by removing side surfaces of the fourth interlayer insulating layer, the gate conductor layer, and the gate insulating layer, the hole having a lower end at a position of the upper surface of the fifth interlayer insulating layer and an upper end at a position higher than an upper surface of the first interlayer insulating layer in the perpendicular direction;

wherein in the second step, the stacked material layers are formed by supplying a material atom of the first metal layer, the first semiconductor layer, the second interlayer insulating layer, the second metal layer, the second semiconductor layer, and the third interlayer insulating layer onto the fifth interlayer insulating layer in the direction perpendicular to the flat surface of the substrate, the fourth step and the fifth step are performed after the second steps, the method further comprises forming a fourth impurity region in the semiconductor pillar and above the second impurity region, the fourth impurity region having the same conductivity type as the second impurity region, the first impurity region, the third impurity region, a portion of the semiconductor pillar that lies between the first impurity region and the third impurity region, and the gate conductor layer comprise a first surrounding gate MOS transistor in which the first impurity region and the third impurity region respectively function as a source and a drain or vice versa, the portion of the semiconductor pillar functions as a channel, and the gate conductor layer functions as a gate, and the second impurity region, the fourth impurity region, a portion of the semiconductor pillar that lies between the second impurity region and the fourth impurity region, and the gate conductor layer comprise a second surrounding gate MOS transistor in which the second impurity region and the fourth impurity region respectively function as a source and a drain or vice versa, the portion of the semiconductor pillar functions as a channel, and the gate conductor layer functions as a gate.

13. The method according to claim 12, wherein the fourth impurity region generates stress acting downward in the semiconductor pillar.

14. The method according claim 12, wherein the first alloy layer and the gate conductor layer are separated and the second alloy layer and the gate conductor layer are separated.

15. The method according to claim 11, wherein, in the fifth step,
the first alloy layer and the second alloy layer are expanded to reach a center of the semiconductor pillar in a plan view.

16. The method according to claim 11, wherein, in the second step,
the first metal layer and a third semiconductor layer not containing donor or acceptor atoms are formed, and donor or acceptor atoms are ion-implanted into the third semiconductor layer to form the first semiconductor layer, and the second metal layer and a fourth semiconductor layer not containing donor or acceptor atoms are formed on the second interlayer insulating layer, and donor or acceptor atoms are ion-implanted into the fourth semiconductor layer to form the second semiconductor layer.

17. The method according to claim 11, wherein, in the second step,
the first metal layer, a fifth semiconductor layer containing donor or acceptor atoms, the second interlayer insulating layer, the second metal layer, and a sixth semiconductor layer having the same conductivity type as the fifth semiconductor layer are formed, and the first semiconductor layer and the second semiconductor layer are formed by ion-implanting donor or acceptor atoms that generate a conductivity type different from that of the fifth semiconductor layer into one or both of the fifth semiconductor layer and the sixth semiconductor layer so that the amount of the donor or acceptor atoms implanted is larger than the amount of the donor or acceptor atoms contained in the fifth semiconductor layer.

18. The method according to claim 11, further comprising:
forming a contact hole that penetrates the second alloy layer and the second interlayer insulating layer and has a bottom that extends to an upper surface, inside, or a lower surface of the first alloy layer; and forming a wiring metal layer that fills the contact hole and electrically connects the first alloy layer and the second alloy layer.

* * * * *

UNITED STATES PATENT AND TRADEMARK OFFICE
CERTIFICATE OF CORRECTION

PATENT NO.         : 9,627,494 B2
APPLICATION NO.    : 14/976691
DATED              : April 18, 2017
INVENTOR(S)        : Fujio Masuoka et al.

Page 1 of 1

It is certified that error appears in the above-identified patent and that said Letters Patent is hereby corrected as shown below:

In the Claims

In Column 23, Claim 12, Line 13, replace "second steps," with --second step,--.

In Column 23, Claim 14, Line 40, after "The method according" insert --to--.

Signed and Sealed this
Seventh Day of August, 2018

Andrei Iancu
*Director of the United States Patent and Trademark Office*